(12) United States Patent
Sjölén et al.

(10) Patent No.: US 9,856,556 B2
(45) Date of Patent: Jan. 2, 2018

(54) PVD COATING FOR METAL MACHINING

(75) Inventors: Jacob Sjölén, Fagersta (SE); Jon Andersson, Västeras (SE); Jörg Vetter, Bergisch Gladbach (DE); Jürgen Müller, Olpe (DE)

(73) Assignee: OERLIKON SURFACE SOLUTIONS AG, PFAEFFIKON, Pfaeffikon (CH)

( * ) Notice: Subject to any disclaimer, the term of this patent is extended or adjusted under 35 U.S.C. 154(b) by 771 days.

(21) Appl. No.: 13/643,022

(22) PCT Filed: Mar. 30, 2011

(86) PCT No.: PCT/EP2011/054896
§ 371 (c)(1),
(2), (4) Date: Mar. 5, 2013

(87) PCT Pub. No.: WO2011/131460
PCT Pub. Date: Oct. 27, 2011

(65) Prior Publication Data
US 2013/0171374 A1 Jul. 4, 2013

(30) Foreign Application Priority Data
Apr. 23, 2010 (EP) .................................... 10405089

(51) Int. Cl.
C23C 14/32 (2006.01)
C23C 14/06 (2006.01)
C23C 30/00 (2006.01)

(52) U.S. Cl.
CPC ........ C23C 14/325 (2013.01); C23C 14/0641 (2013.01); C23C 30/005 (2013.01)

(58) Field of Classification Search
None
See application file for complete search history.

(56) References Cited

U.S. PATENT DOCUMENTS

| 5,071,693 A * | 12/1991 | Sue ..................... C23C 14/0641 |
| | | 427/248.1 |
| 2002/0039670 A1 * | 4/2002 | Ishikawa ............... C23C 30/005 |
| | | 428/697 |
| 2003/0148145 A1 | 8/2003 | Yamamoto |
| 2004/0115484 A1 | 6/2004 | Horling et al. |
| 2004/0237840 A1 | 12/2004 | Yamamoto |
| 2006/0175190 A1 * | 8/2006 | Schuetze et al. ........ 204/192.38 |

(Continued)

FOREIGN PATENT DOCUMENTS

| AU | WO 2010003902 A1 * | 1/2010 | ......... C23C 14/0036 |
| CN | 1813079 | 8/2006 | |

(Continued)

OTHER PUBLICATIONS

Pham (Materials Science Forum vol. 695 (2011) pp. 182-185).*
International Search Report dated Apr. 2, 2012 for PCT Patent Application No. PCT/EP2011/054896, 11 pages.

(Continued)

*Primary Examiner* — Joel Horning
(74) *Attorney, Agent, or Firm* — Greenblum & Bernstein, P.L.C.

(57) ABSTRACT

The present invention relates to a wear resistant coating suitable to be deposited on cutting tool inserts for chip forming metal machining. The coating comprises at least two layers with different grain size, but with essentially the same composition. The coating is deposited by Physical Vapor Deposition (PVD).

20 Claims, 39 Drawing Sheets

(56) References Cited

U.S. PATENT DOCUMENTS

| | | |
|---|---|---|
| 2006/0222767 A1 | 10/2006 | Sato |
| 2010/0038232 A1 | 2/2010 | Yamamoto |
| 2010/0062257 A1* | 3/2010 | Morstein et al. ............ 428/408 |
| 2010/0213055 A1 | 8/2010 | Vetter |
| 2011/0188950 A1 | 8/2011 | Ahlgren |
| 2011/0293909 A1* | 12/2011 | Ni ...................... C23C 14/0641 |
| | | 428/213 |
| 2012/0009037 A1 | 1/2012 | Larsson |

FOREIGN PATENT DOCUMENTS

| | | |
|---|---|---|
| CN | 101406967 | 4/2009 |
| CN | 101509120 | 8/2009 |
| CN | 101689468 | 3/2010 |
| EP | 2 050 831 A1 | 4/2009 |
| JP | 6-170610 | 6/1994 |
| JP | 2003-034858 | 2/2003 |
| JP | 2004-099966 | 4/2004 |
| JP | 2006-116642 | 5/2006 |
| JP | 2006-316351 | 11/2006 |
| WO | WO2009/128782 | 10/2009 |

OTHER PUBLICATIONS

Written Opinion of the International Searching Authority dated Apr. 2, 2012 for PCT Patent Application No. PCT/EP2011/054896, 10 pages.

Hovsepian, P.Eh. et al.; "TiAlN Based Nanoscale Multilayer Coatings Designed to Adapt Their Tribological Properties at Elevated Temperatures,"; *Thin Solid Films*; 2005; pp. 160-168; vol. 485.

* cited by examiner

Results:

Influence Current/Evaporator Type 2

FIGURE 14

Results:

Discussion: Morphology and minor w-AlN

HYPOTHESIS:

The fine morphology is combined with the existence of a minor w-AlN phase.

FIGURE 23

Discussion: Minor AlN-phases 4: Critical Al content ?

Nothing is more stable than the change: if we vary process parameters

The phase stability of c-Ti$_{1-x}$Al$_x$N not only depends on the Al content but also on the Al distribution of the metal sublattice/ number of Ti–Al bonds. (changes of the electronic structure, bond energy, and configurational entropy)

The metastable solubility limit of AlN in cubic Ti$_{1-x}$Al$_x$N can be increased by 10% from 0.64 to 0.74 by affecting the Al distribution on the metal sublattice and hence the number of Ti–Al bonds.

It may be speculated that the Al distribution on the metal sublattice and hence the solubility may be controlled by the synthesis conditions.

FIGURE 27

Discussion: Morphology and minor w-AlN

Other possible driving forces ?

fcc $Al_{1-x}Ti_xN$
+
w-AlN fcc $Al_xTi_{1-x}N$

1. Nitrogen content/population ?
2. ........

FIGURE 29

Summary and Conclusion

1. The evaporator current (growth rate) of type 1 evaporator influences the morphology and structure for Al66:Ti34. Higher current (growth rate) results in finer morphologies.

2. Another important influence is given by the magnetic field of the evaporator.

3. It is possible to tailor coating properties from: columnar growth to superfine growth.

→

5. Superfine growth might be the result of the generation of w-AlN areas detectable as a broad diffraction peak 11-20.

Example combination of evaporators equipped with a weak magnetic field + evaporators with strong magnetic
Claim 3 and 4 and 6
80A
Weak
67:34
lower
highest
AlxTiy
...
fcc
50 A and more
Strong
67:33
lower
highest
AlxTiy
...
fcc + w-AlN
FIGURE 35

PVD COATING FOR METAL MACHINING

This application is a U.S. National Phase under 35 USC 371 of PCT Application No. PCT/EP011/054896 filed Mar. 30, 2011, which claims priority to the European Application No. 10405089.3, filed Apr. 23, 2010, the disclosures of which are incorporated by reference herein.

The present invention relates to a wear resistant coating suitable to be deposited on cutting tool inserts for chip forming metal machining. The coating comprises at least two layers with different grain size, but with essentially the same composition. The coating is deposited by Physical Vapour Deposition (PVD).

The increased productivity in modern chip forming metal machining requires tools with high reliability and excellent wear properties. It has been known since the end of the 1960s that tool life can be significantly improved by applying a suitable coating to the surface of the tool. Chemical Vapour Deposition (CVD) was the first deposition technique used for cutting tools and this method is still commonly used for deposition of TiN, Ti(C,N), and $Al_2O_3$ layers. Physical Vapour Deposition (PVD) was introduced in the 1980s and has since then been developed from deposition of stable metallic compounds like TiN or Ti(C,N) to include deposition of multicomponent, metastable compounds like (Ti,Al)N, (Ti,Si)N, or (Al,Cr)N, by such methods as sputtering or cathodic arc evaporation. The properties of these coatings are optimised for specific applications, and thus the performance of the coatings is significantly reduced outside their respective application areas. As an example, fine grained coatings with typical grain sizes of about 5-30 nm find a typical use in end milling with very small chip thicknesses, while coarse grained coatings with typical grain sizes of about 50-500 nm are generally superior as chip thickness and temperature increase in milling and turning applications using indexable inserts.

SUMMARY OF THE INVENTION

It is an object of the present invention to provide a coating with high machining performance in a broad area of applications ranging from very small to large chip thicknesses.

The present invention relates to a wear resistant coating suitable to be deposited on cutting tool inserts for chip forming metal machining. The coating according to the invention comprises at least two layers with essentially the same composition, but with different grain sizes. The coating has a wide application area ranging from fine machining using end mills to medium or rough machining with indexable inserts. The coating is deposited by Physical Vapour Deposition.

The invention also provides for method of coating a machine cutting tool, comprising depositing, on the machine cutting tool, plural AlTiN alternating coating layers using cathodic arc evaporation with a cathode, wherein said plural AlTiN alternating coating layers differ in average grain width and comprise at least one first layer comprising a first composition and a first average grain width of between 2 nm and 50 nm. At least one second layer is in contact with the at least one first layer and comprises a second composition and a second average grain width of between 30 nm and 500 nm. The first composition is the same as the second composition to within plus or minus 3 at. % units for each chemical element of said first and second compositions. A ratio of the first average grain width to the second average grain width is greater than two.

The depositing may comprise depositing with a same cathode the plural AlTiN alternating coating layers using cathodic arc evaporation. The depositing may comprise depositing, with identical composition cathodes, the plural AlTiN alternating coating layers using cathodic arc evaporation. The depositing may comprise depositing, with identical composition cathodes, the plural AlTiN alternating coating layers using cathodic arc evaporation.

The depositing may utilize process parameters for the at least one first layer that include a first magnetic field at the cathode, a first deposition temperature, a first evaporation current, and a first bias voltage.

The depositing may utilize process parameters for the at least one second layer that include a second magnetic field at the cathode that is different than the first magnetic field, a second deposition temperature, a second evaporation current, and a second bias voltage.

The depositing may utilize process parameters for the at least one second layer that include a second magnetic field at the cathode, a second deposition temperature that is different than the first deposition temperature, a second evaporation current and a second bias voltage.

The depositing may utilize process parameters for the at least one second layer that include a second magnetic field at the cathode, a second deposition temperature, a second evaporation current that is different than the first evaporation current, and a second bias voltage.

The depositing may utilize process parameters for the at least one second layer that include a second magnetic field at the cathode, a second deposition temperature, a second evaporation current that is between 100 and 300 A and the first evaporation current is between 30 and 100 A, and a second bias voltage.

The depositing may utilize process parameters for the at least one second layer that include a second magnetic field at the cathode, a second deposition temperature, a second evaporation current, and a second bias voltage that is different than the first bias voltage.

The at least one first layer may have a thickness of between 0.03 μm and 5 μm. The at least one first layer may have a thickness of between 0.05 μm and 2 μm. The at least one second layer may have a thickness of between 0.1 μm and 5 μm. The at least one second layer may have a thickness of between 0.2 μm and 2 μm.

The plural AlTiN alternating coating layers may comprise between 2 and 200 layers. The plural AlTiN alternating coating layers may comprise between 2 and 40 layers. The plural AlTiN alternating coating layers may comprise between 2 and 40 layers.

An overall thickness of the plural AlTiN alternating coating layers may be between 0.3 μm and 20 μm. An overall thickness of the plural AlTiN alternating coating layers may be between 0.5 μm and 10 μm.

The invention also provides for a method of coating a machine cutting tool, comprising depositing, on the machine cutting tool, plural AlTiN alternating first and second coating layers using cathodic arc evaporation with a cathode, wherein said plural AlTiN alternating first and second coating layers differ in average grain width. The plural first layers may comprise a first composition and a first average grain width of between 2 nm and 50 nm. The plural second layers may comprise a second composition and a second average grain width of between 30 nm and 500 nm. The first composition is the same as the second composition to within plus or minus 3 at. % units for each chemical element of said first and second compositions. A ratio of the first average grain width to the second average grain width is greater than two.

BRIEF DESCRIPTION OF THE DRAWINGS

FIG. 14 shows a chart that includes information of influence current/evaporator type 2;

FIG. 23 shows a chart with the description Morphology and minor w-AlN and includes hypothesis information;

FIG. 27 shows a chart with the description Minor AlN—phases 4: Critical Al content and includes information of phase stability and metastable solubility;

FIG. 29 shows a chart with the description Morphology and minor w-AlN and includes possible driving forces information;

FIG. 30 shows a chart with the description Summary and Conclusion;

FIG. 35 shows a chart with the description Example combination of evaporators equipped with a weak magnetic field+evaporators with a strong magnetic fields;

DETAILED DESCRIPTION OF THE INVENTION

Figure 1:
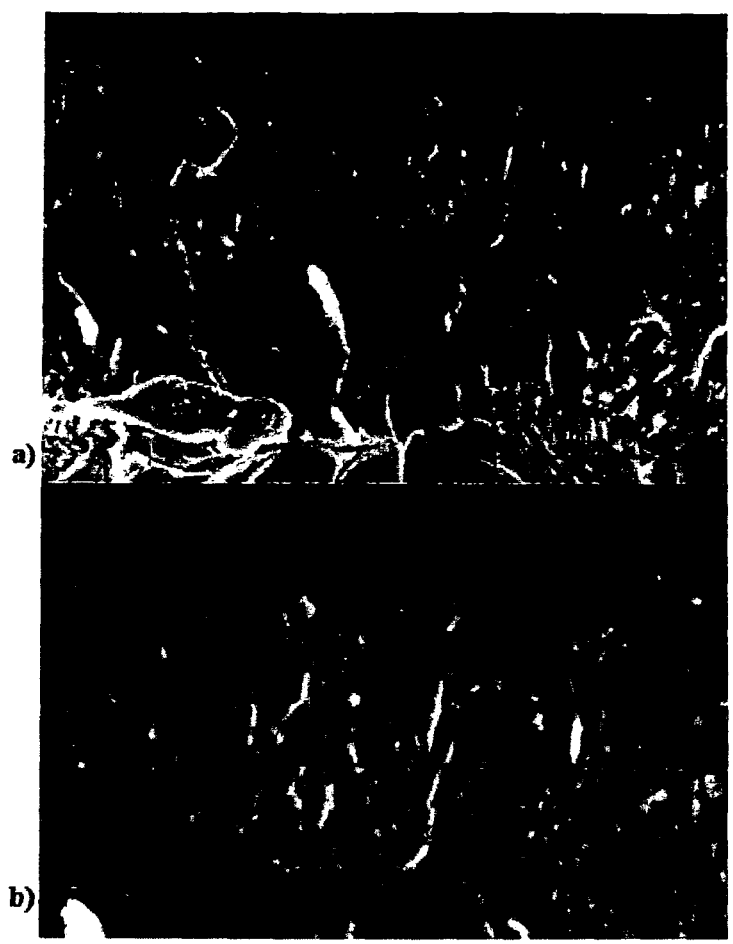
FIG. 1 shows fracture cross section scanning electron microscopy (SEM) images of a coating according to the invention. The coating contains two fine grained layers (marked A) and two coarse grained layers (marked B)
Figure 2:
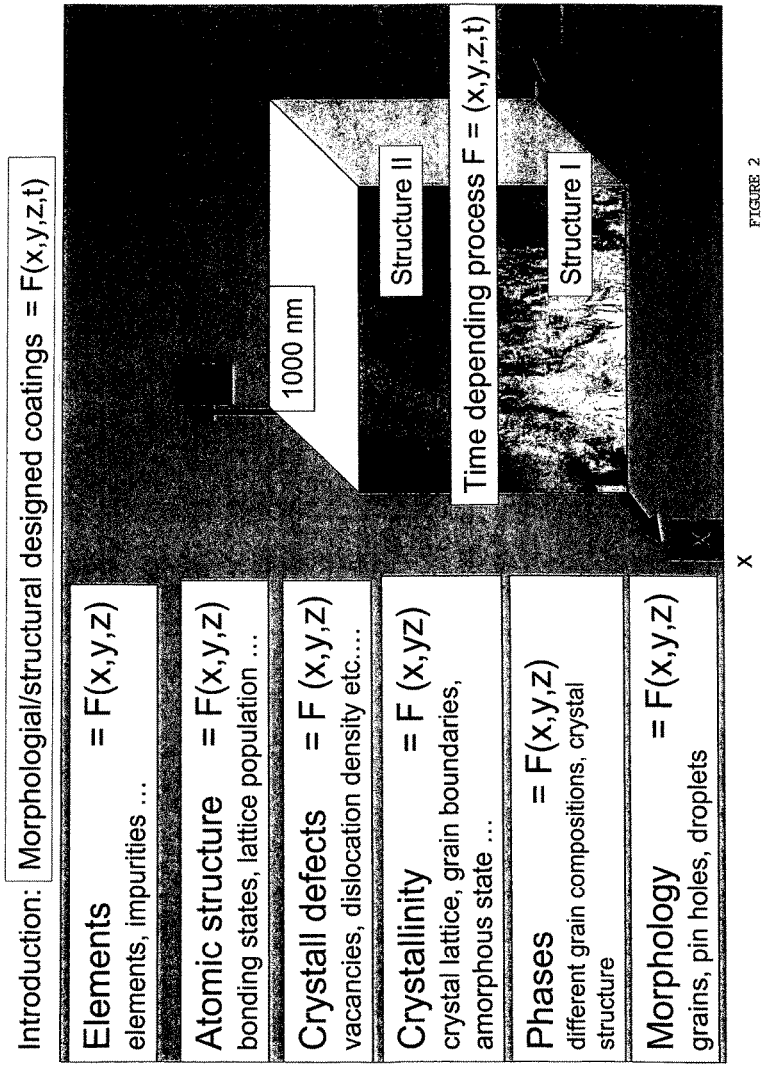
FIG. 2 shows a chart with the description Morphologial/structural design coatings and describes elements, atomic structure, crystal defects, crystallinity, phases and morphology as well as time depending process.
Figure 3:
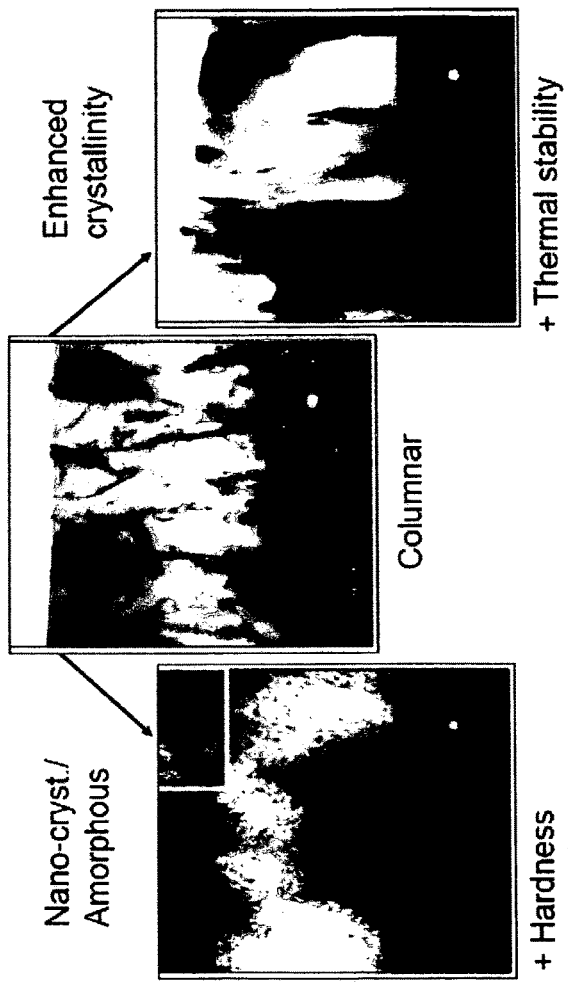
FIG. 3 shows a chart with the description One universal Morphology/Structure and describes microstructure.
Figure 4:
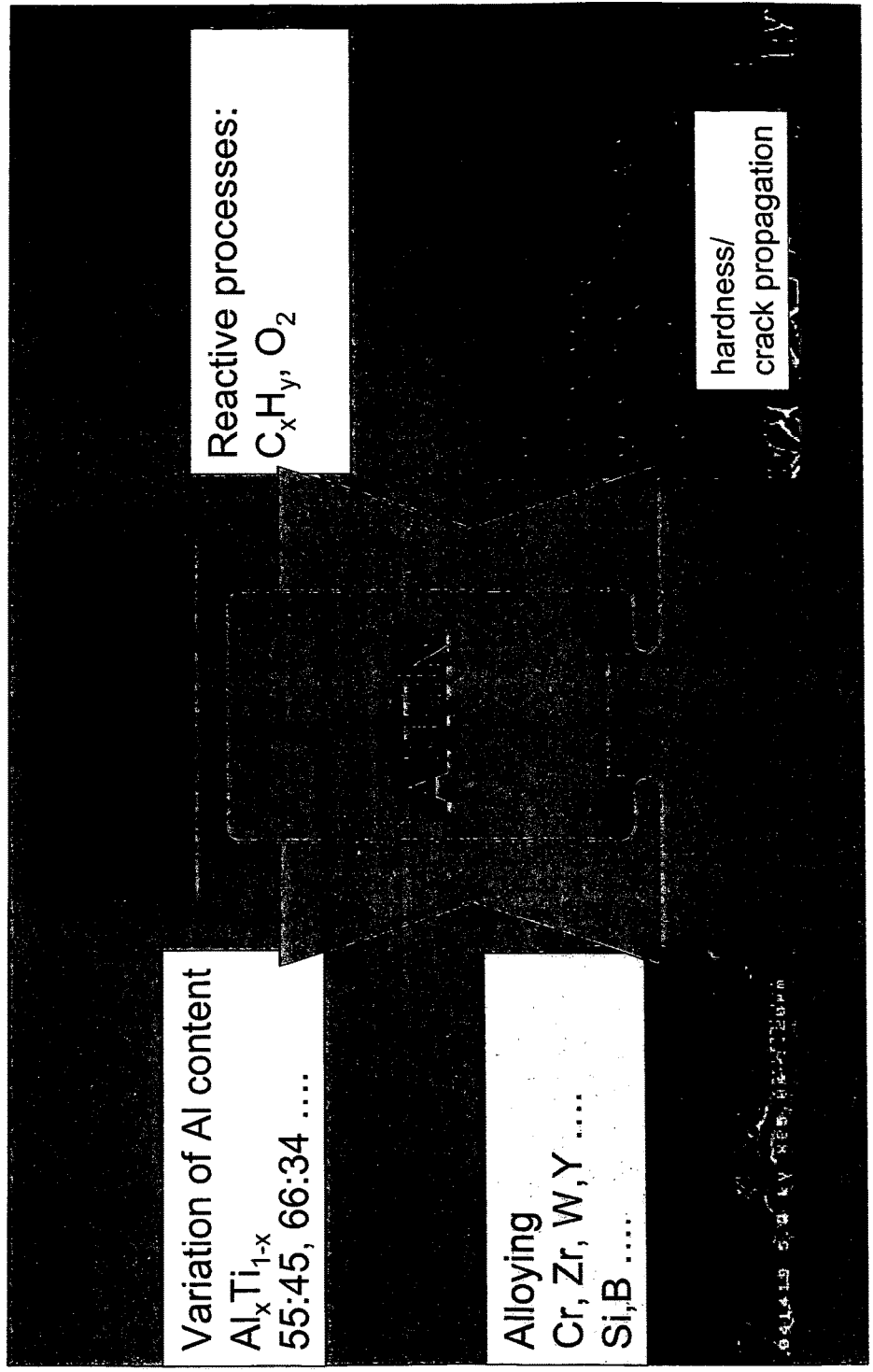
FIG. 4 shows a chart with the description Main variations of the AlTiN composition/architecture and describes variation of Al content, alloying, reactive processes and hardness/crack propogation.
Figure 5:
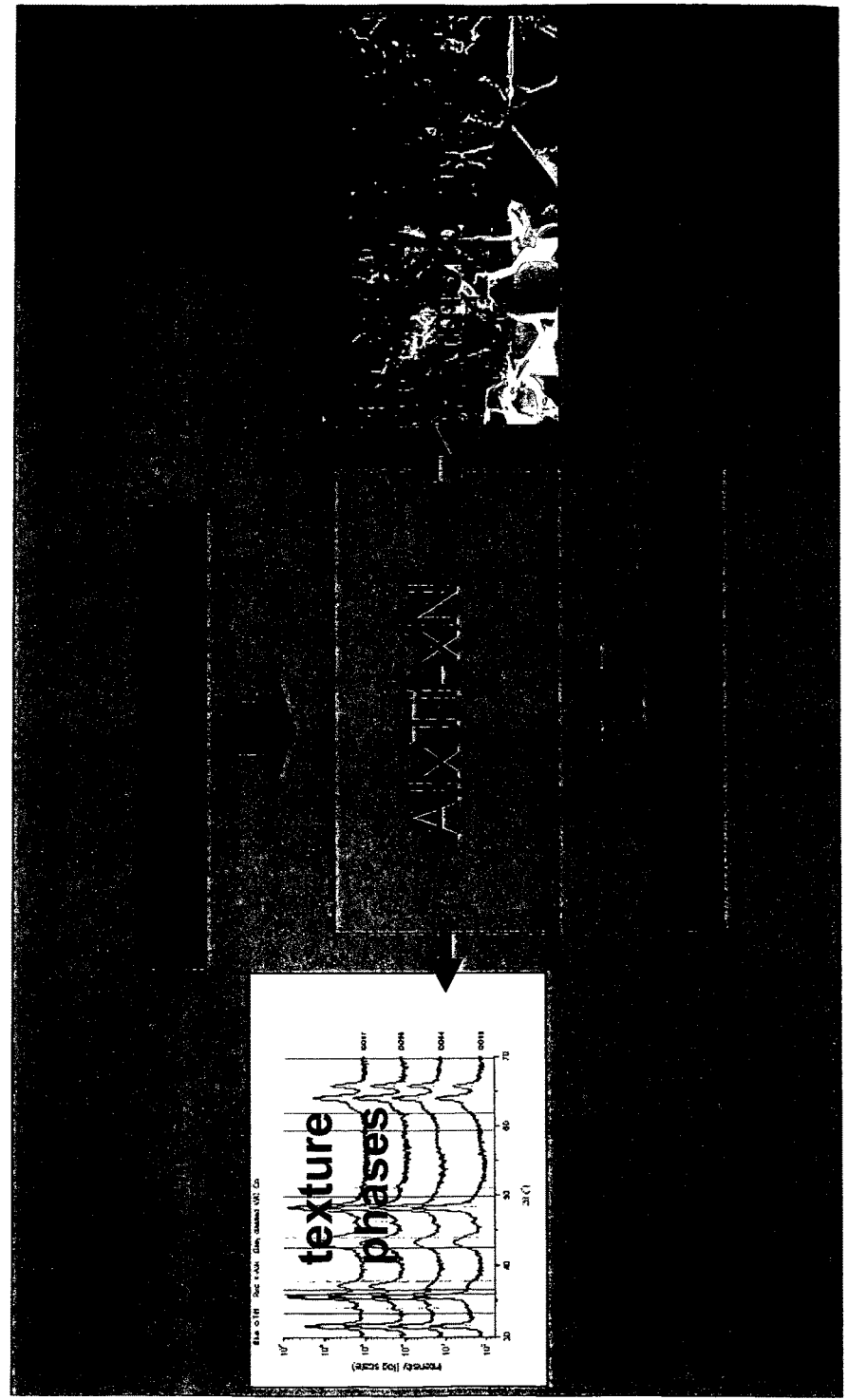
FIG. 5 shows a chart with the description Subject of the present work that includes information of texture and phases.
Figure 6:
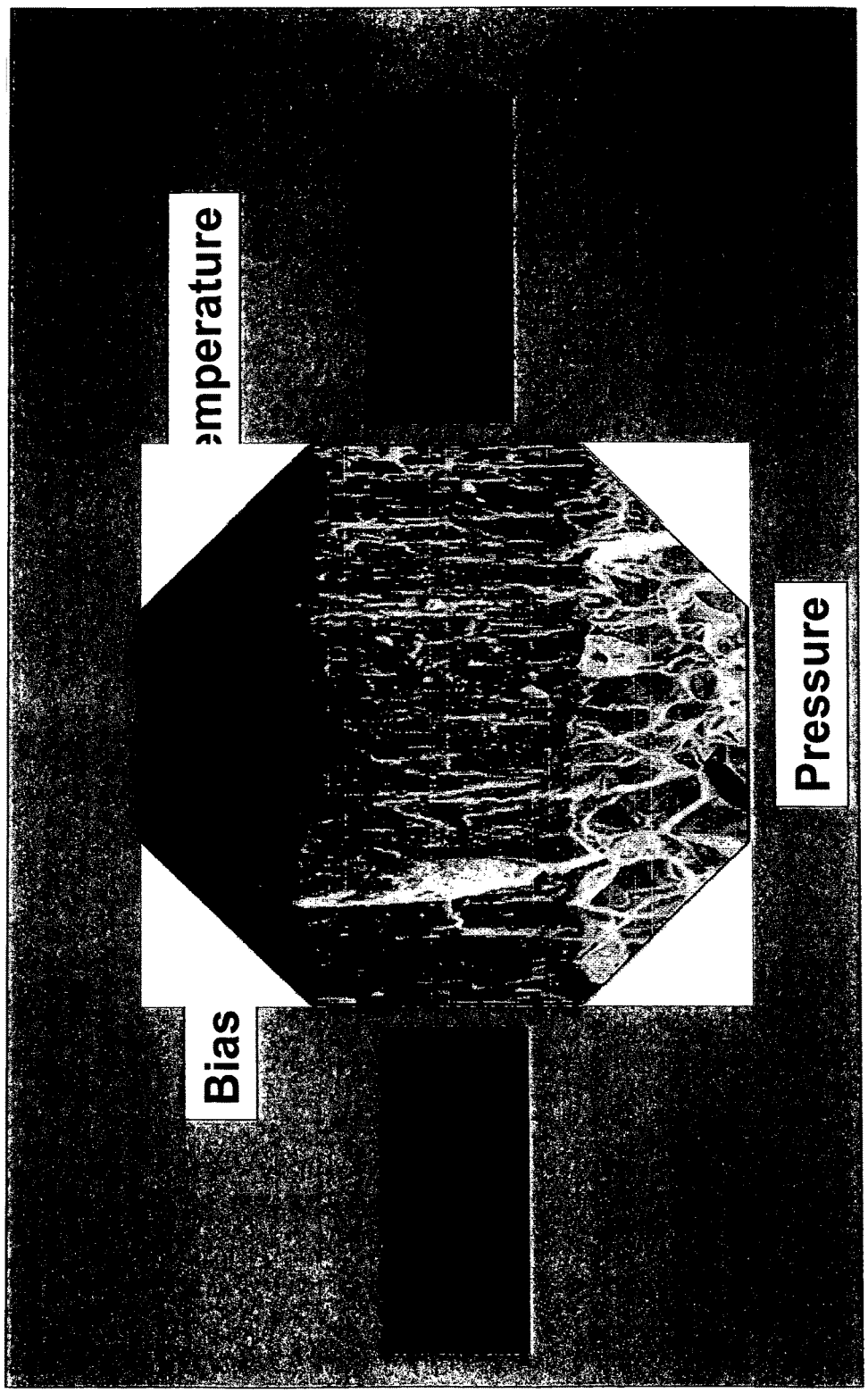
FIG. 6 shows a chart with the description Investigation of evaporation conditions and includes information of bias, temperature and pressure.
Figure 7:
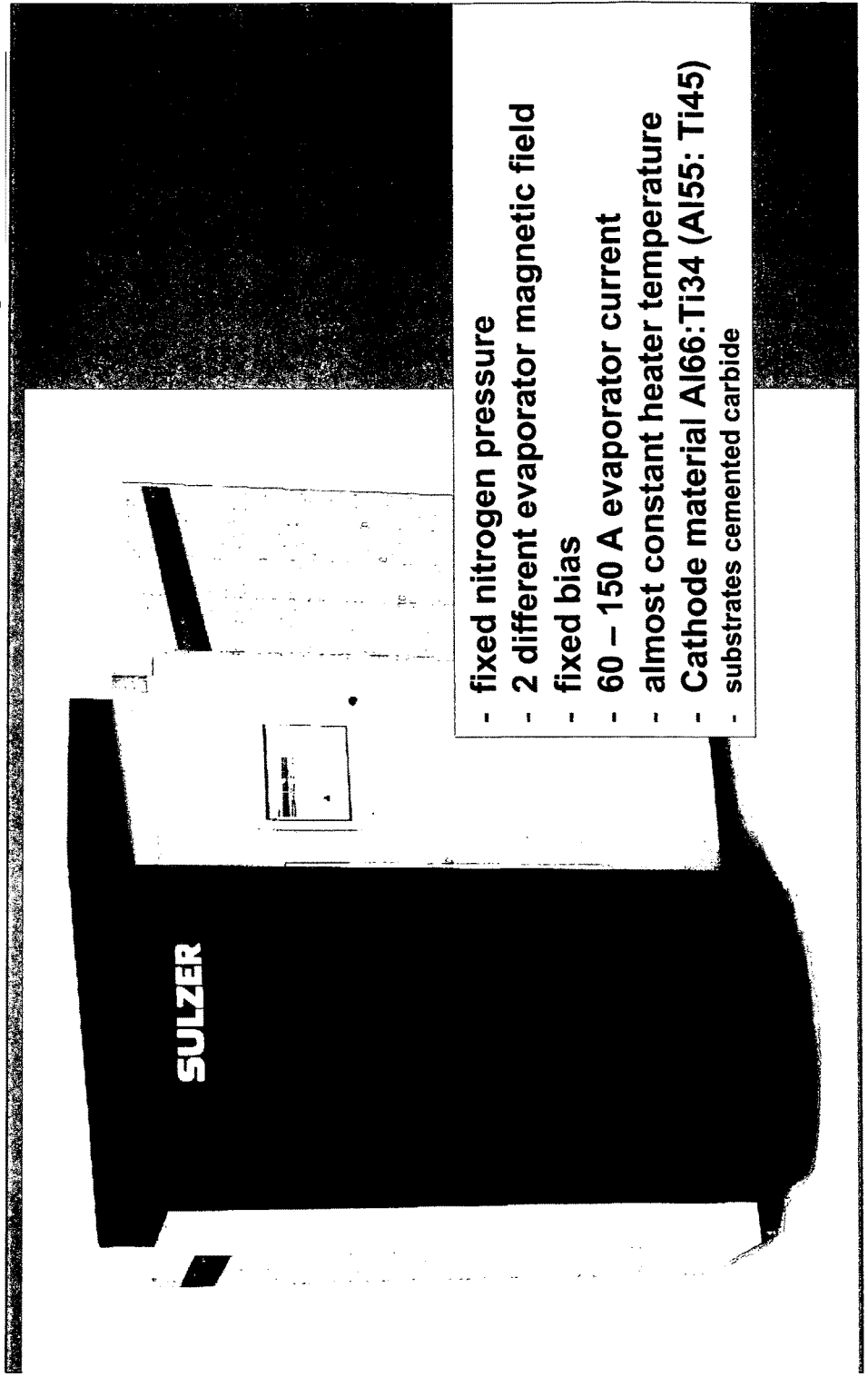
FIG. 7 shows a chart with the description Experiments were made in DOMINO PVD system and includes information of fixed nitrogen pressure, fixed bias, evaporator current, constant heater temperature and cathode material.
Figure 8:
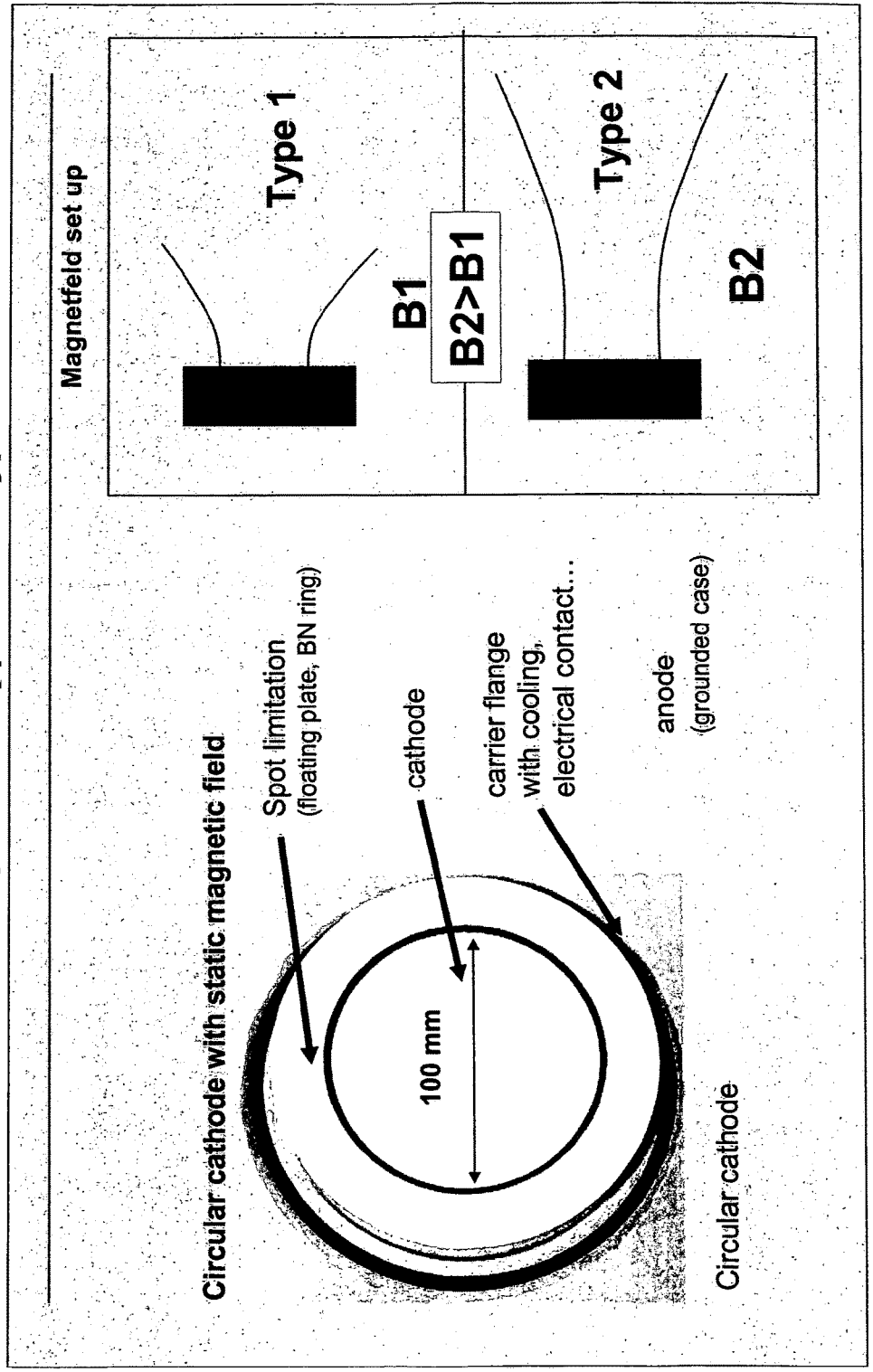
FIG. 8 shows a chart with the description Arc evaporators Type 1 and Type 2 and includes information of a circular cathode with static magnetic field.
Figure 9:
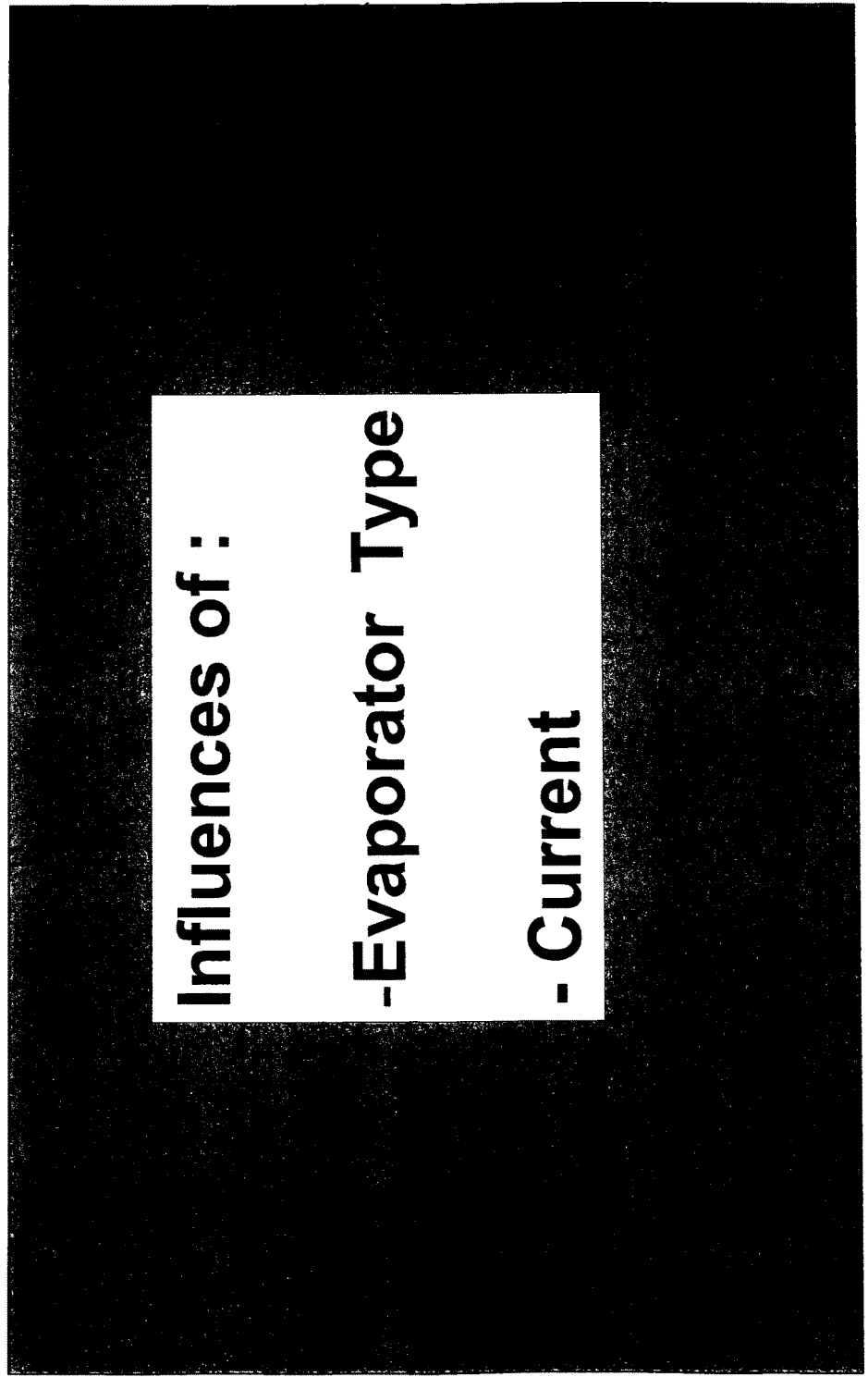
FIG. 9 shows a chart that includes information of influences of evaporator type and current.
Figure 10:
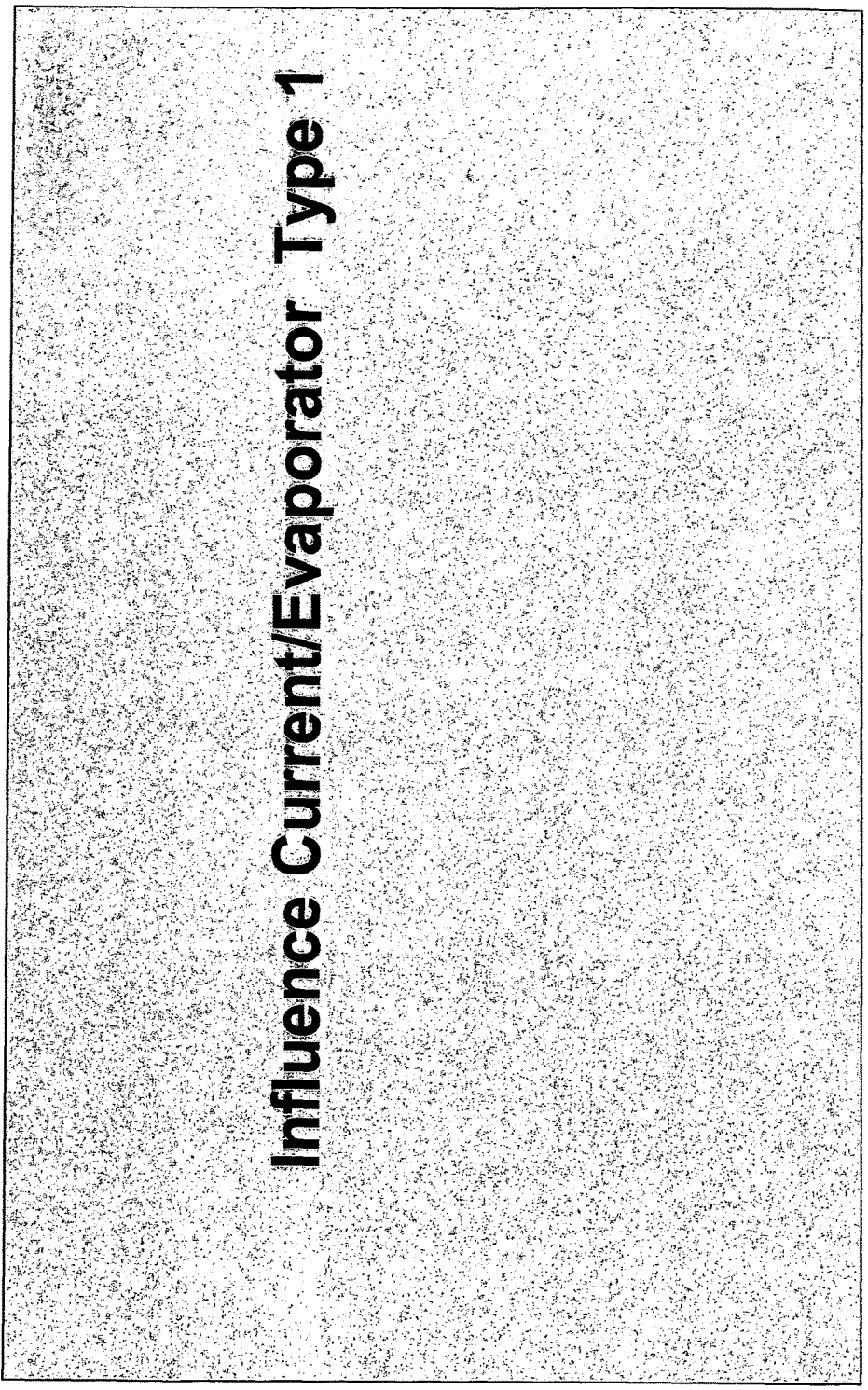
FIG. 10 shows a chart that includes information of influence current/evaporator type 1.
Figure 11:
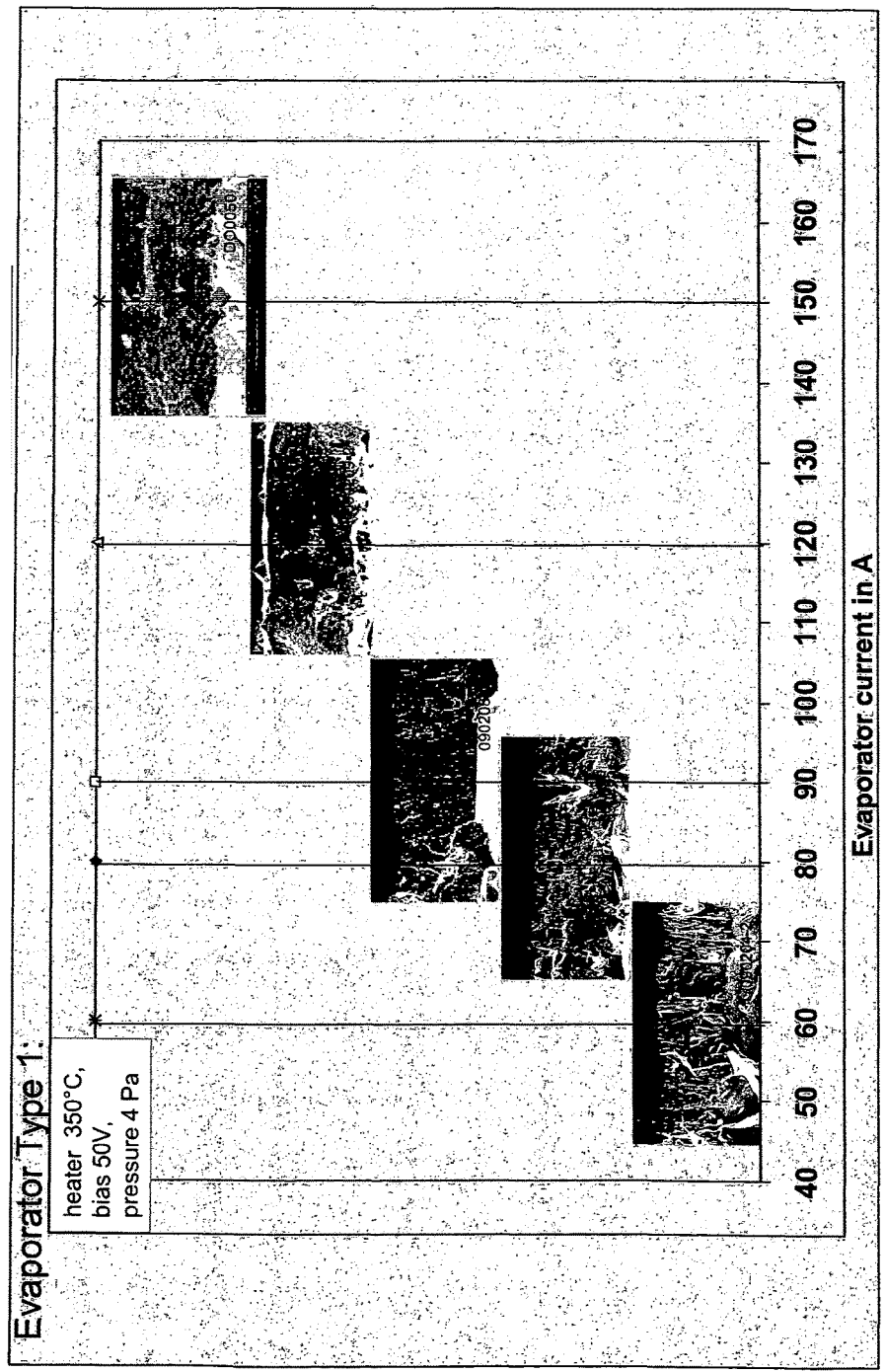
FIG. 11 shows a chart with the description AlTiN with evaporator type 1 at different currents and includes evaporator current information of an evaporator Type 1.
Figure 12:
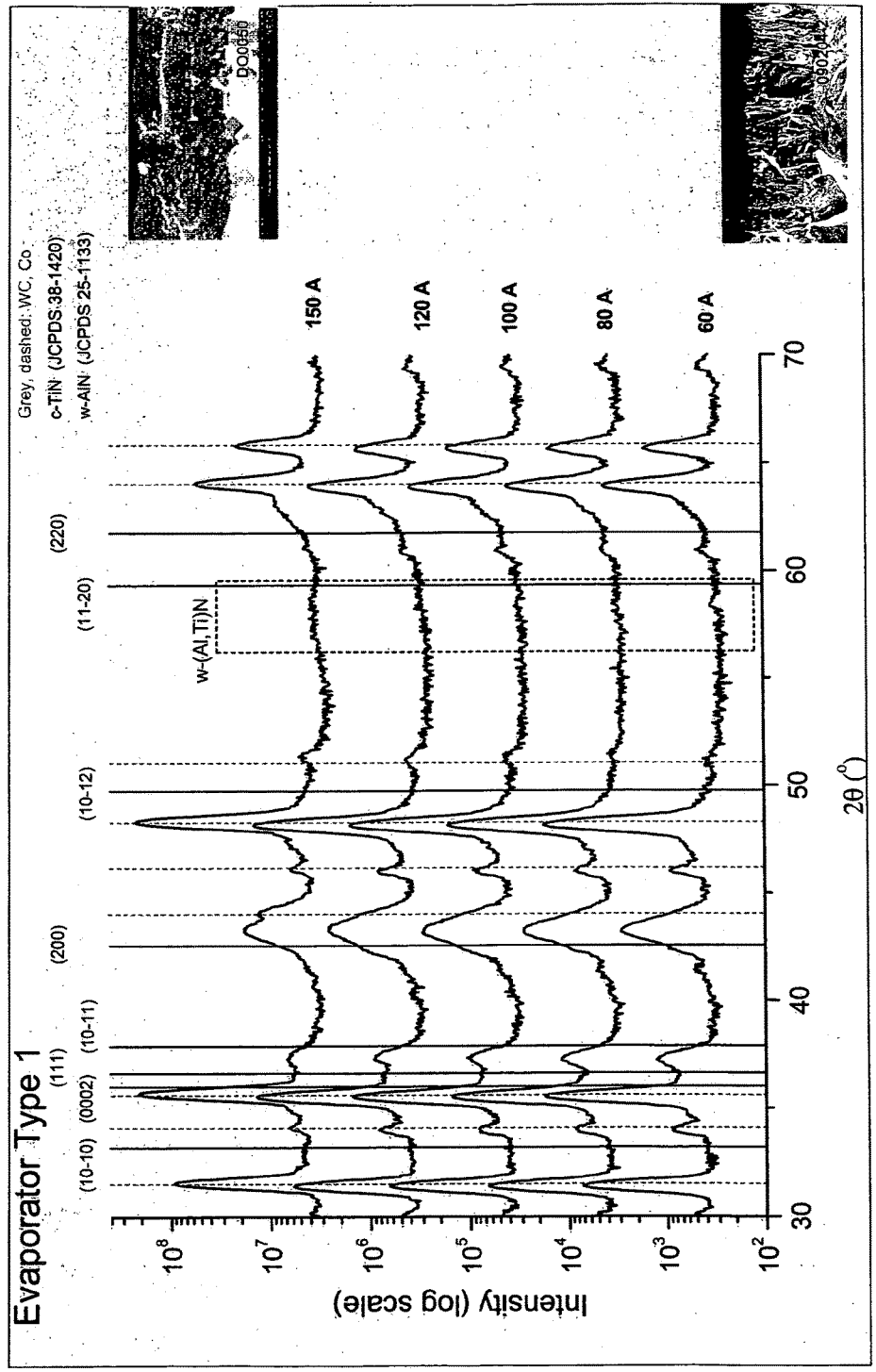
FIG. 12 shows a chart with the description AlTiN with evaporator type 1 at different currents and includes intensity information of an evaporator Type 1.
Figure 13:
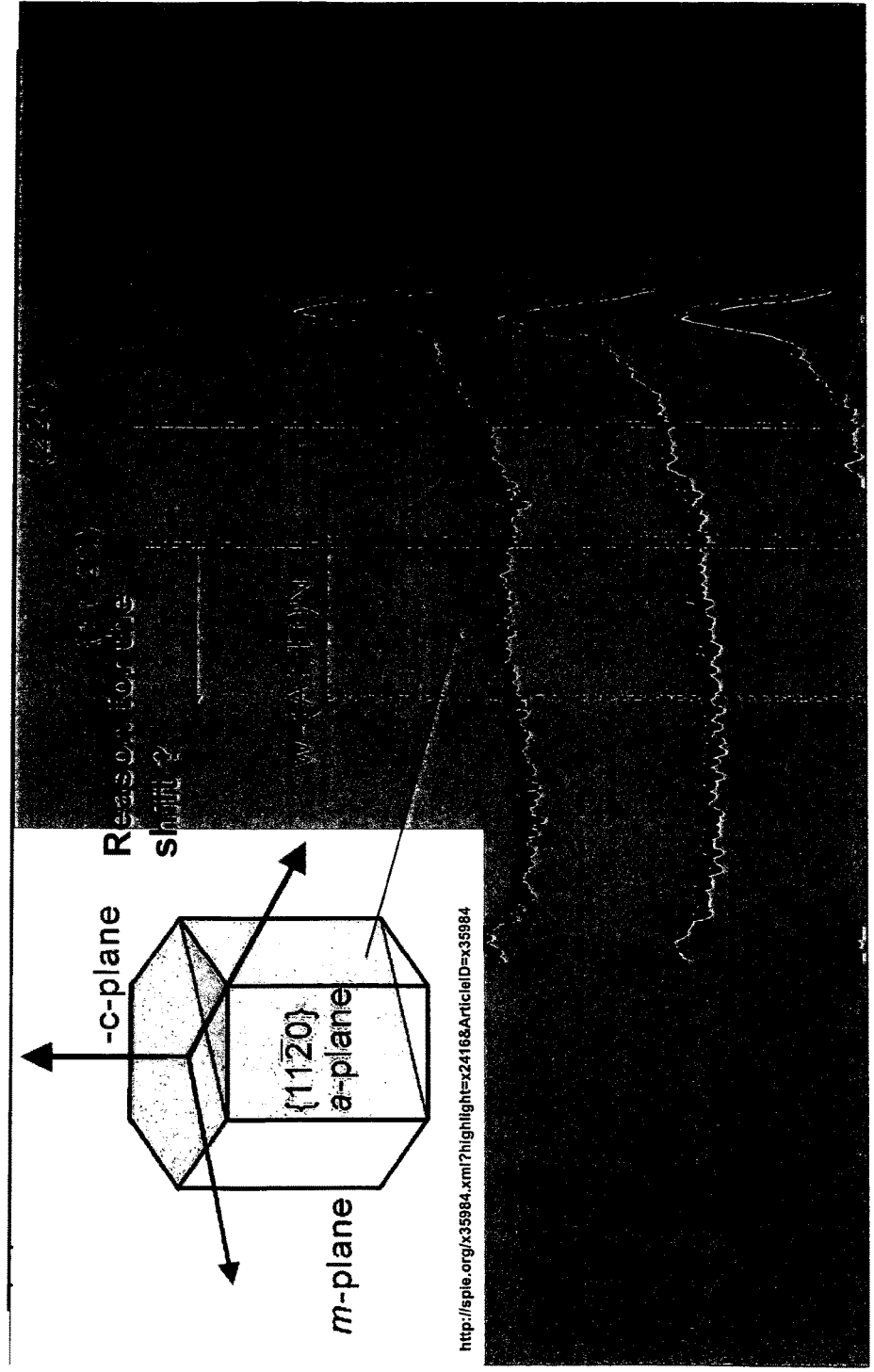
FIG. 13 shows a chart with the description What do we believe to see? and includes "a", "c" and "m" plane information.
Figure 15:
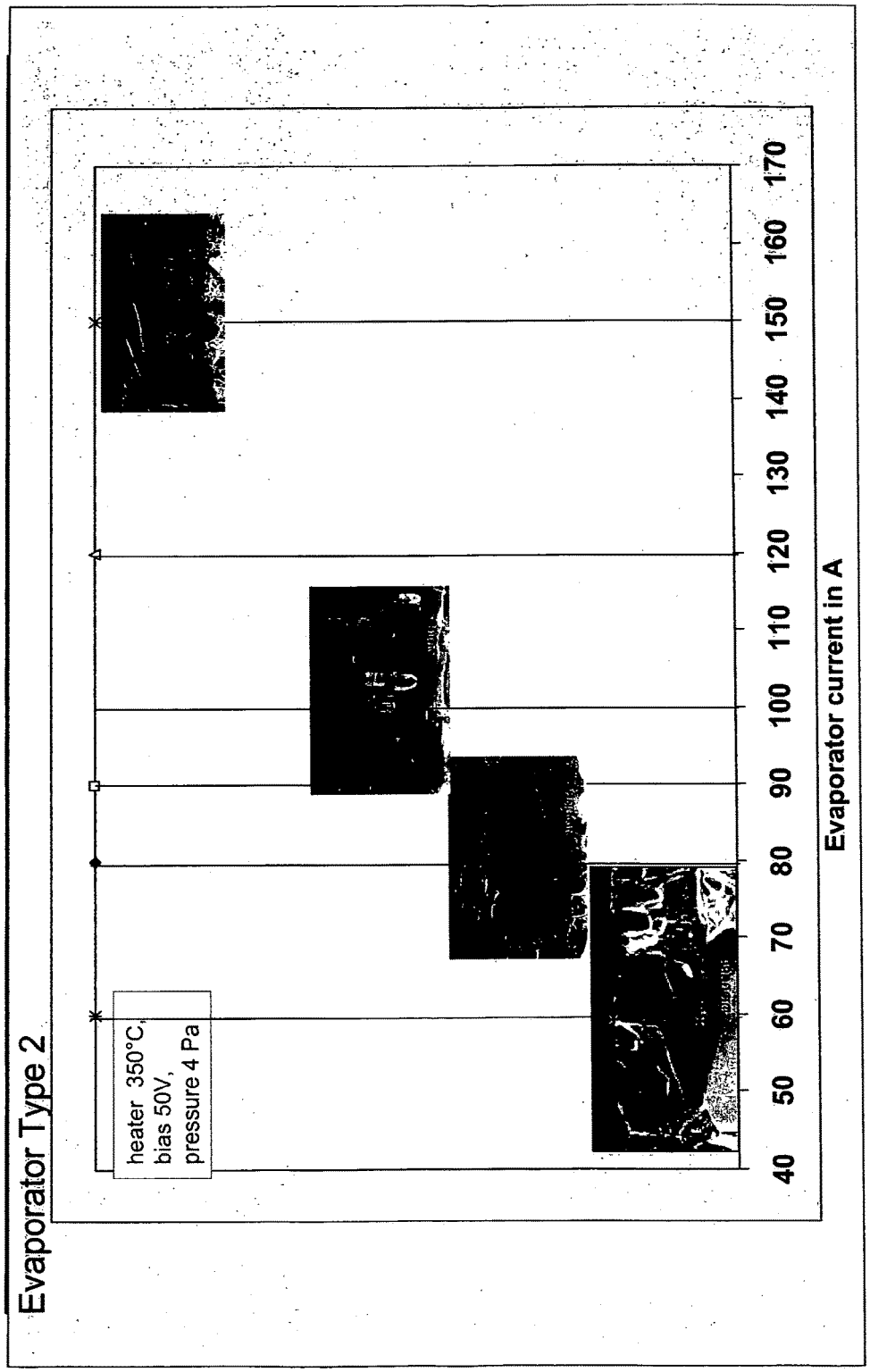
FIG. 15 shows a chart with the description AlTiN with evaporator type 2 at different currents and includes evaporator current information of an evaporator Type 2.
Figure 16:
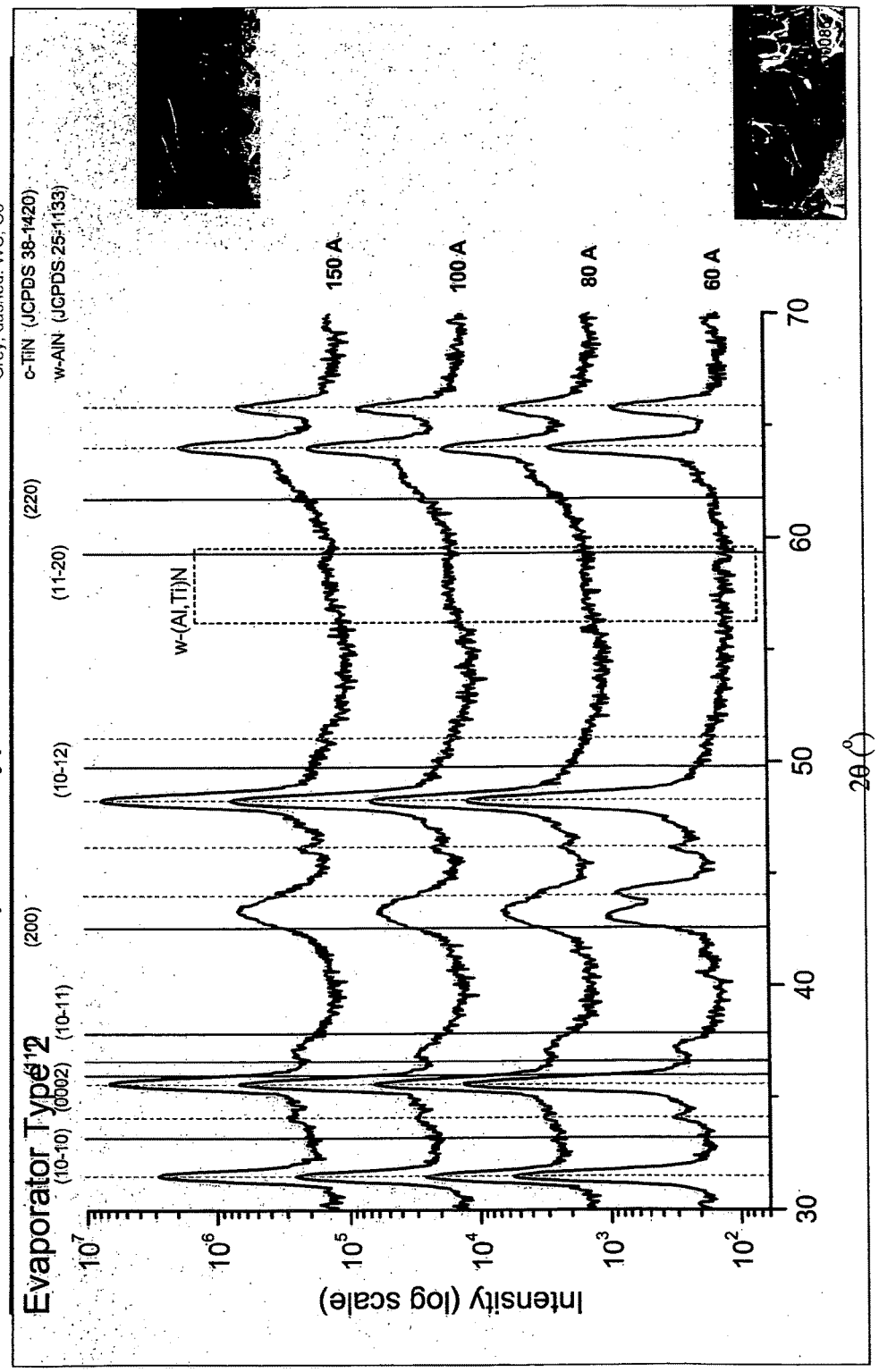
FIG. 16 shows a chart with the description AlTiN with evaporator type 2 at different currents and includes intensity information of an evaporator Type 2.
Figure 17:
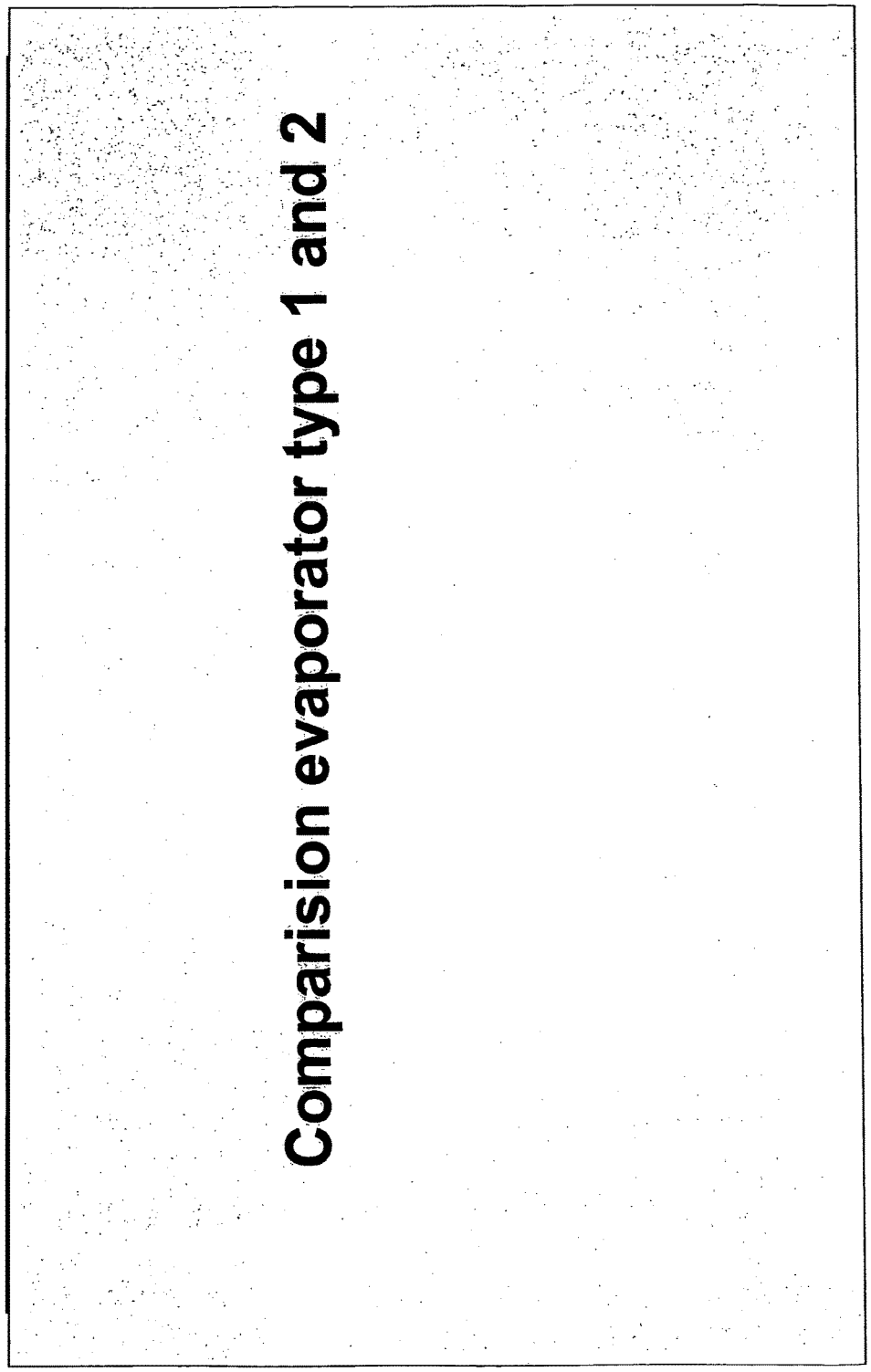
FIG. 17 shows a chart with the description Comparison evaporator type 1 and 2.
Figure 18:
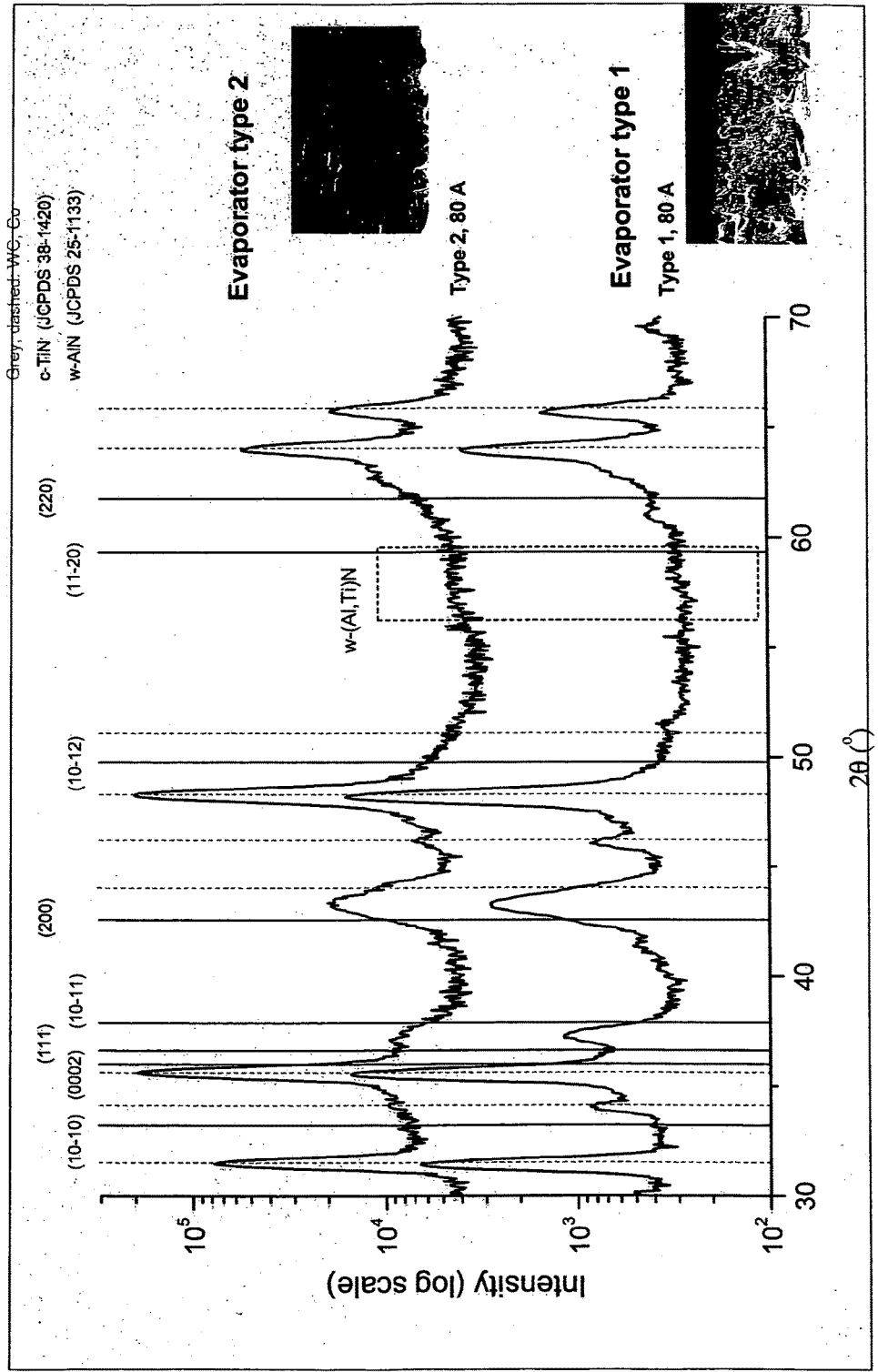
FIG. 18 shows a chart with the description Same current: different evaporator types and includes intensity information of evaporator Type 1 and 2.
Figure 19:
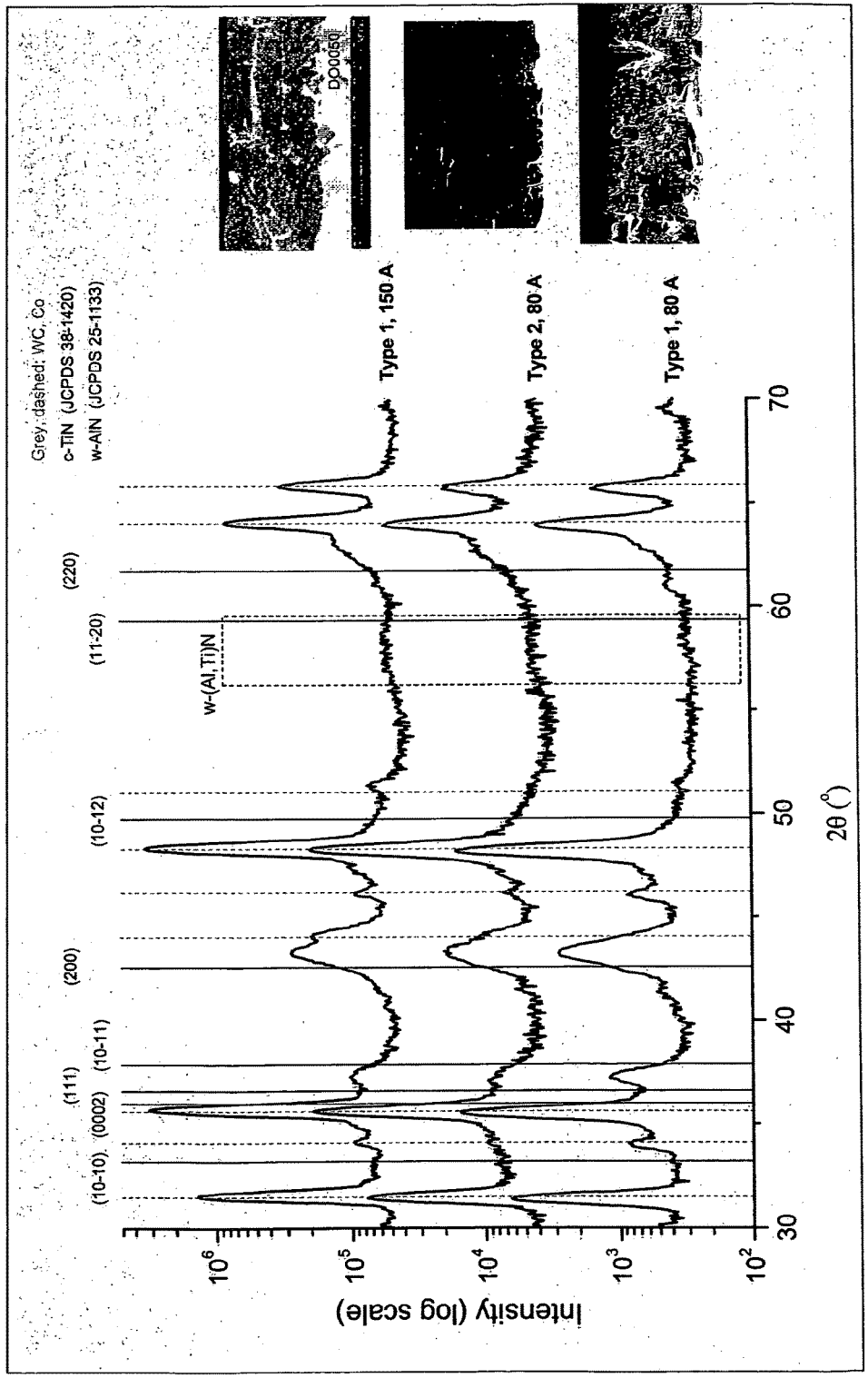
FIG. 19 shows a chart with the description AlTiN—comparison Type 1 and Type 2/different currents and includes intensity information.
Figure 20:
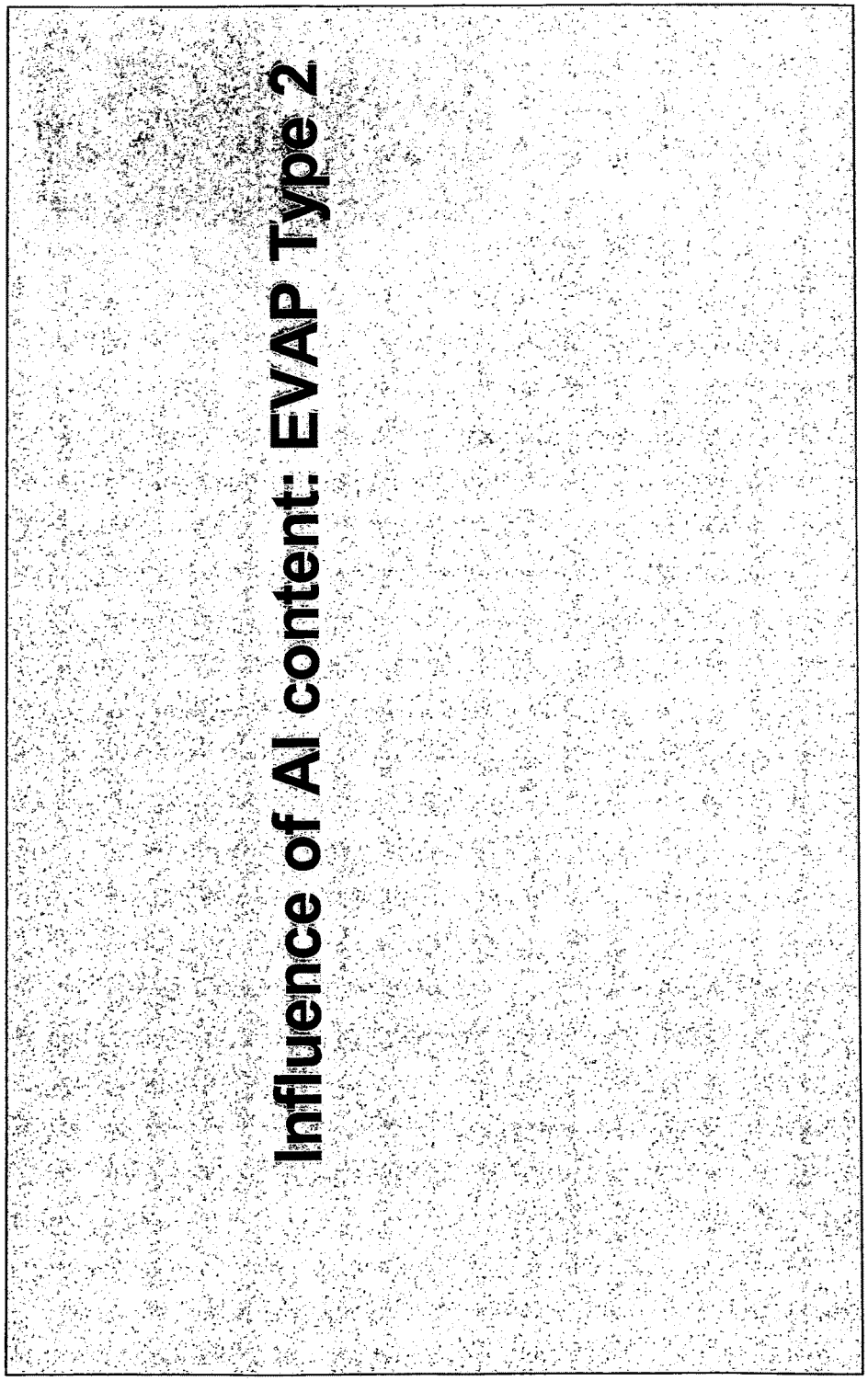
FIG. 20 shows a chart with the description Influence of Al content: EVAP Type 2.
Figure 21:
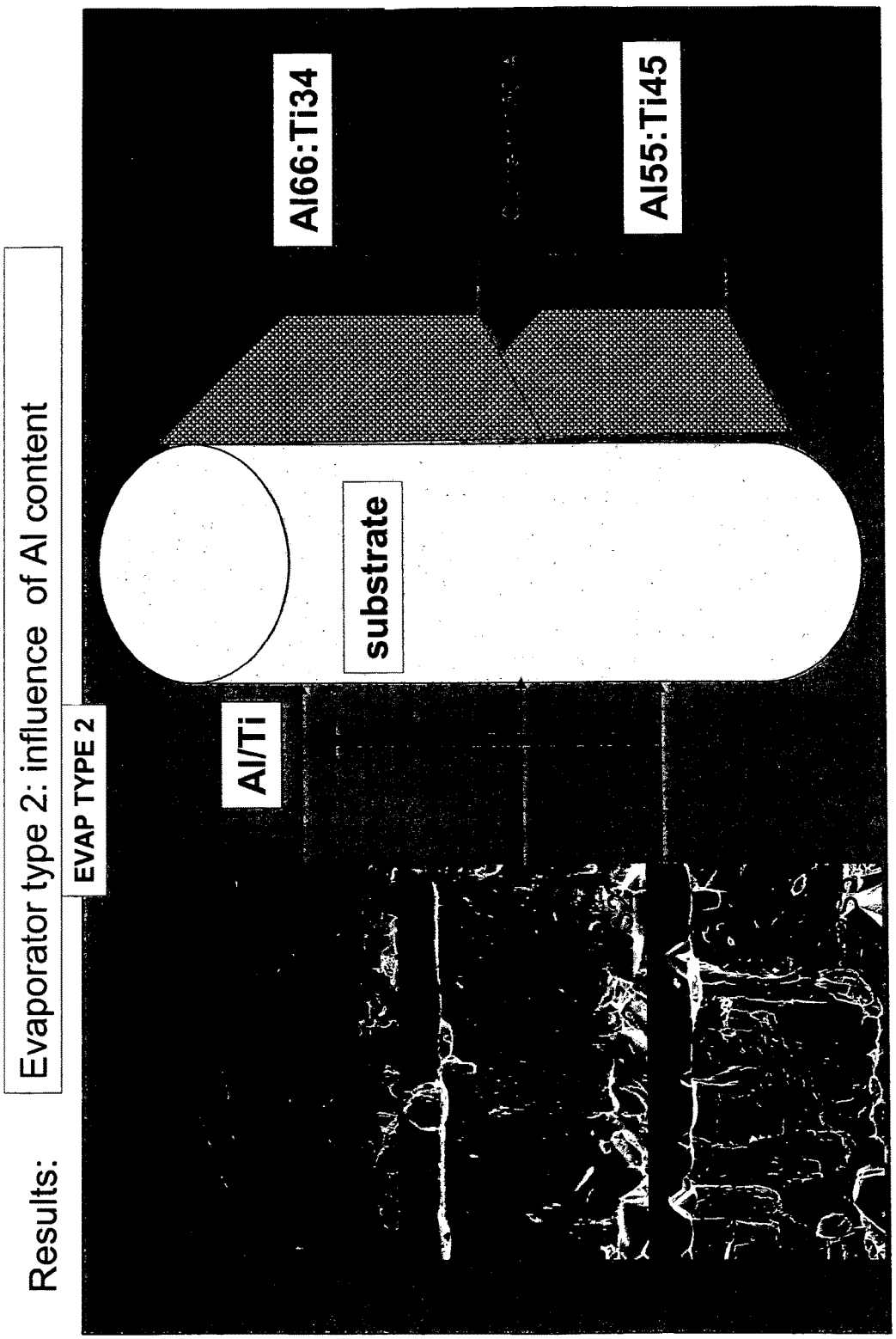
FIG. 21 shows a chart with the description Evaporator type 2: influence of Al content.
Figure 22:
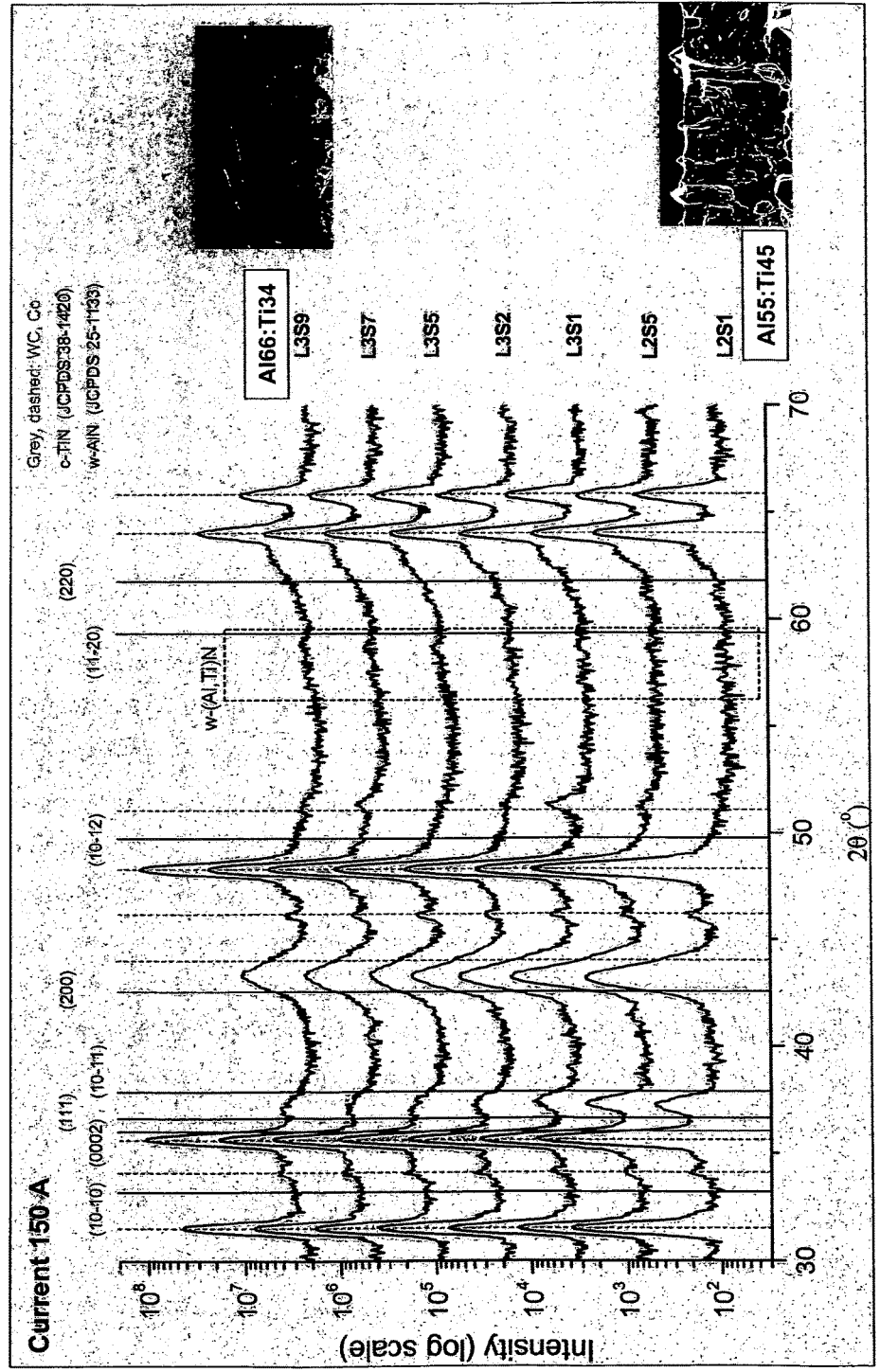
FIG. 22 shows a chart with the description Evaporator type 2: influence of Al content and includes intensity information.
Figure 24:
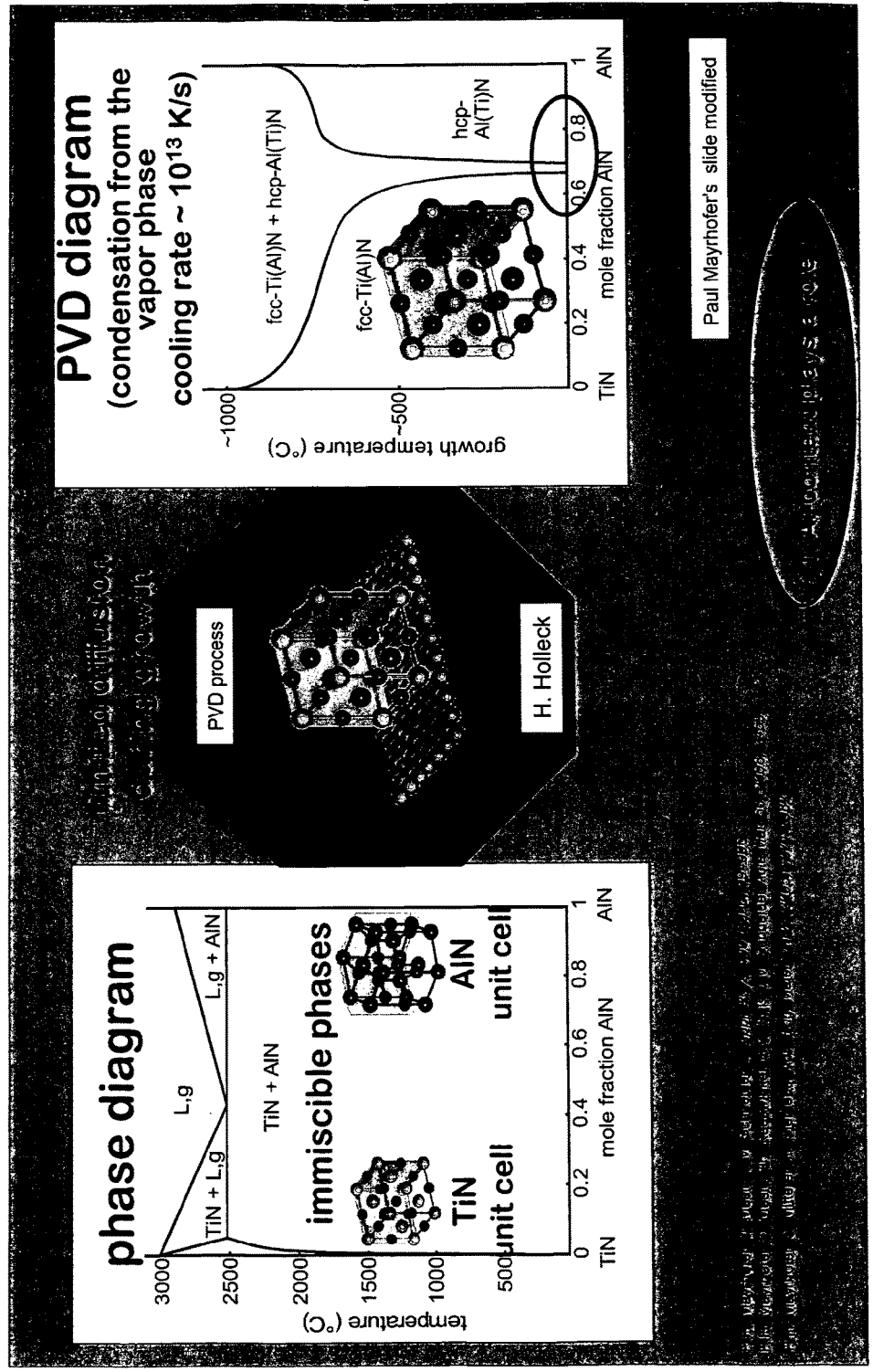
FIG. 24 shows a chart with the description Minor AlN—phases 1: Composition and includes a phase diagram and PVD diagram.
Figure 25:
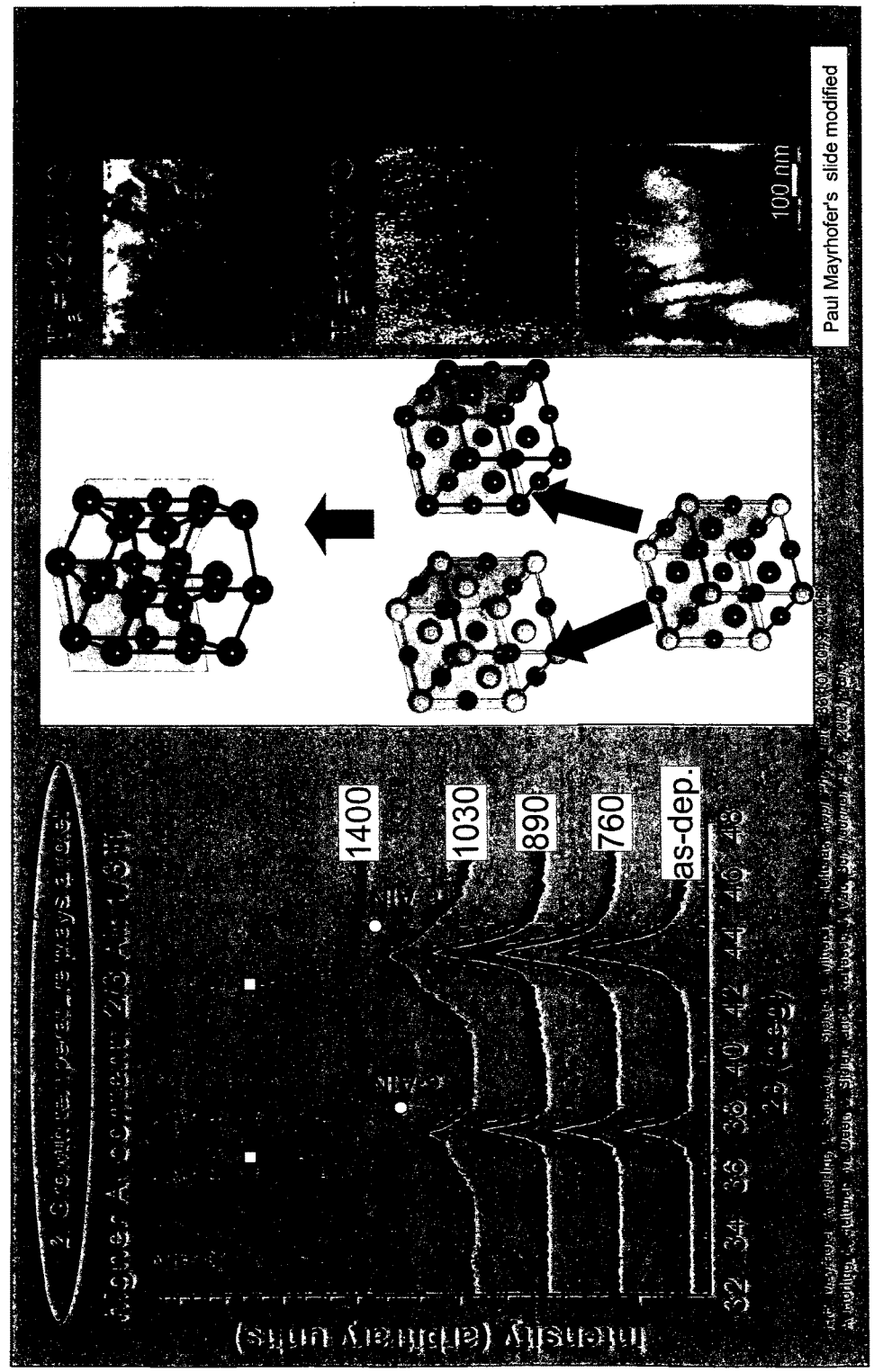
FIG. 25 shows a chart with the description Minor AlN—phases 2: TEMPERATURE and includes intensity information.
Figure 26:
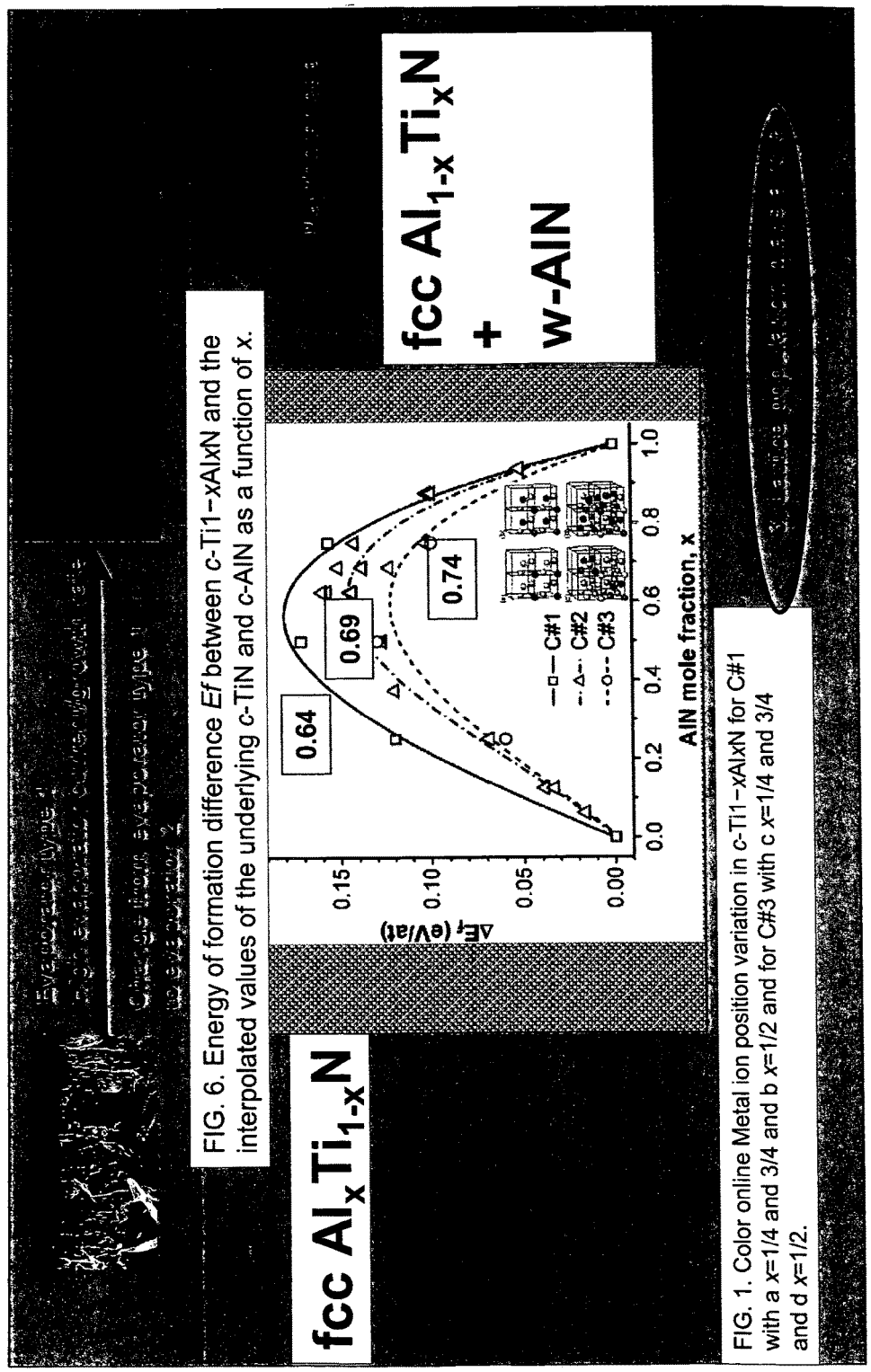
FIG. 26 shows a chart with the description Minor MN—phases 3: Lattice population I.
Figure 28:
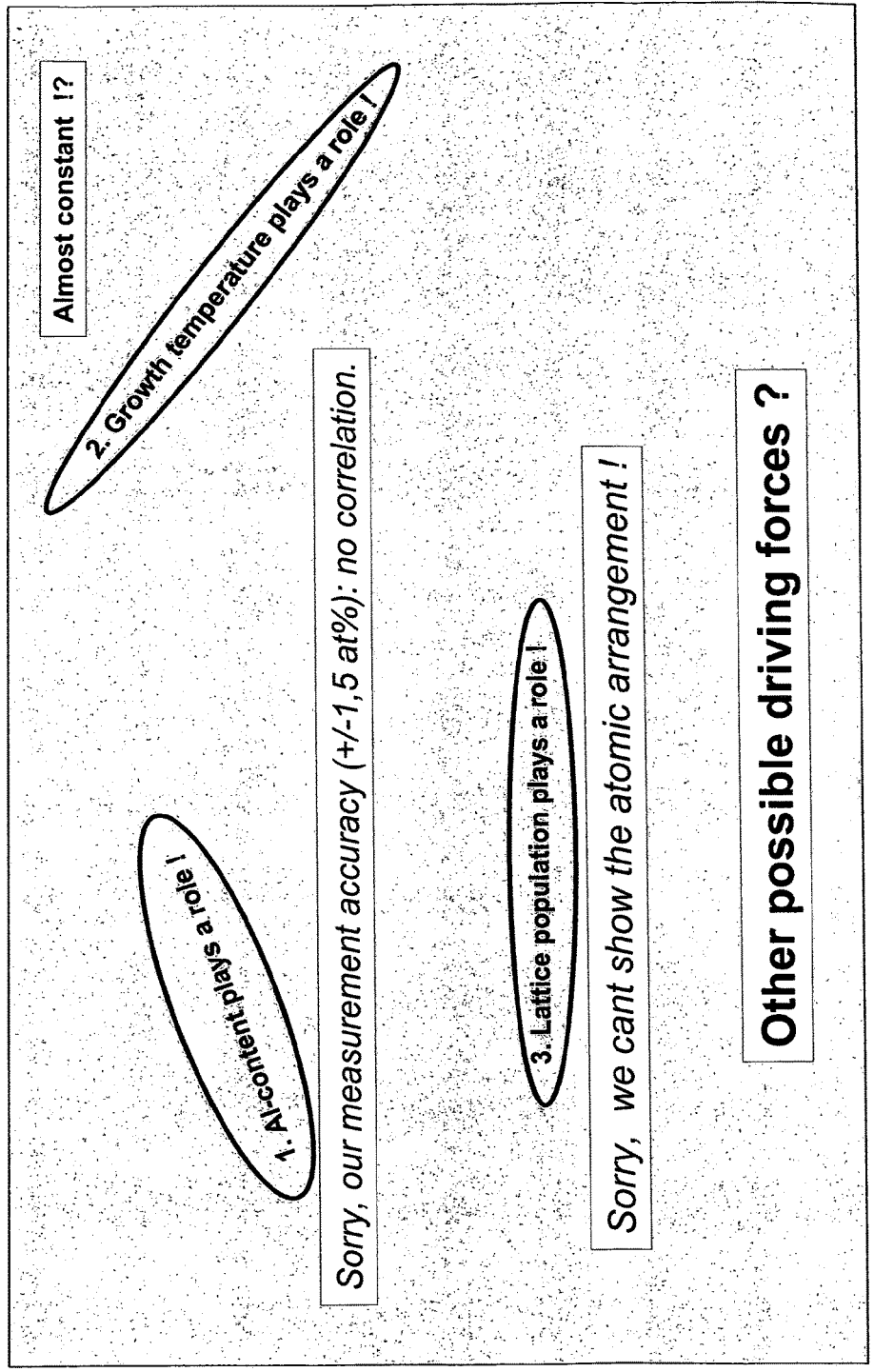
FIG. 28 shows a chart with the description Why does a change of source type/current might cause w-AlN formation? and includes information of Al-content, growth temperature and lattice population.
Figure 31:
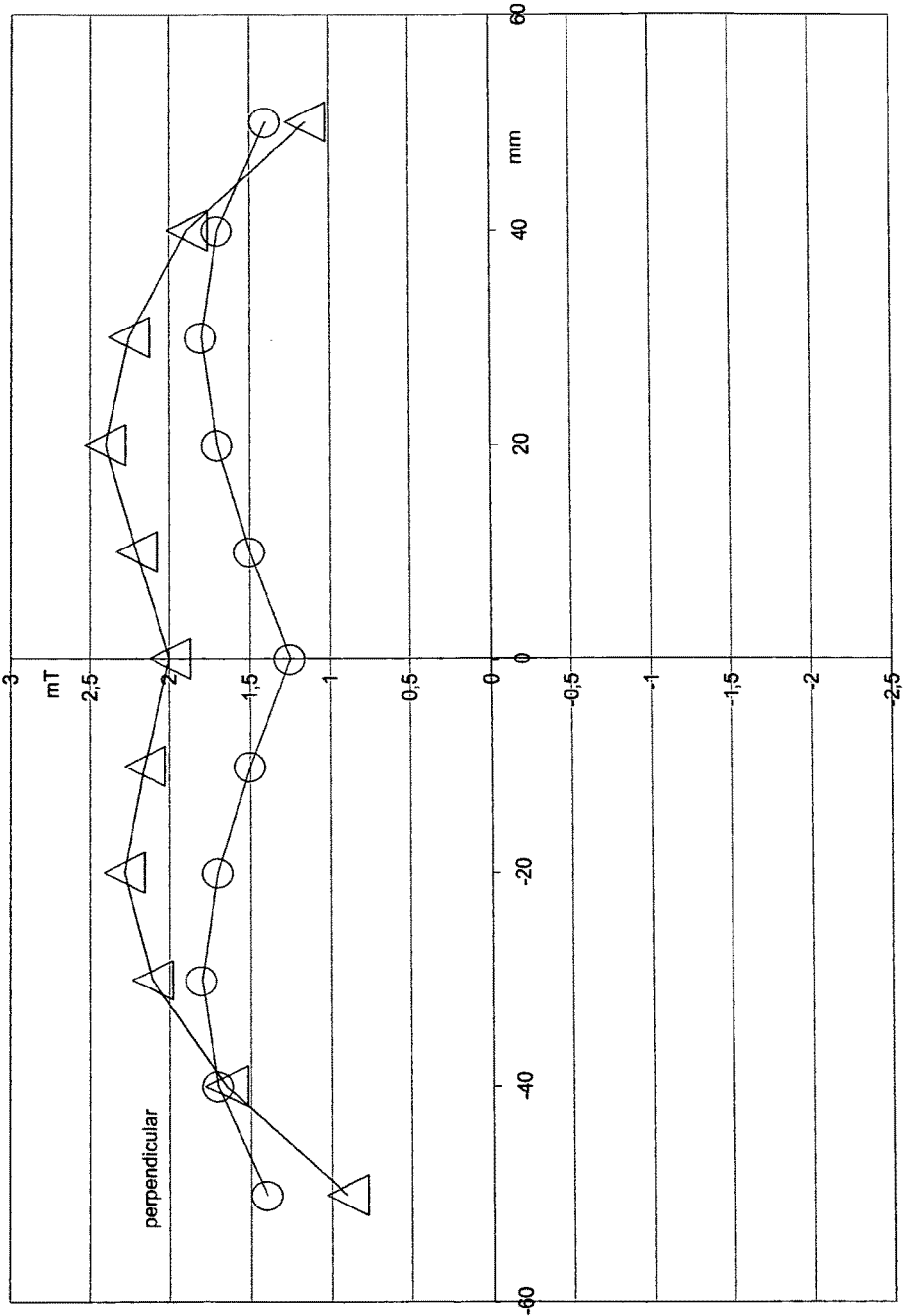
FIG. 31 shows a chart with the description Examples of typical weak magnetic field at the cathode surface.
Figure 32:
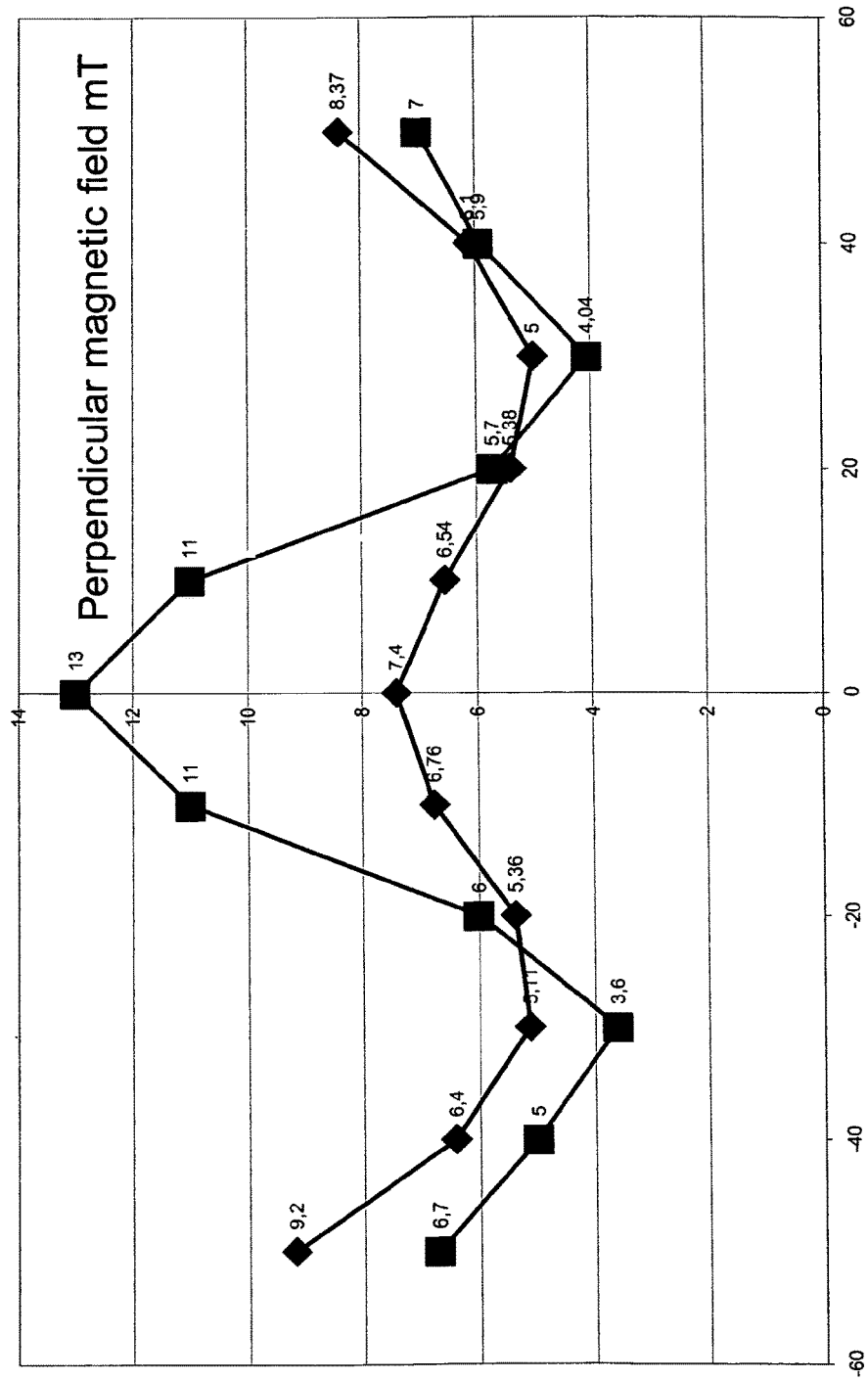
FIG. 32 shows a chart with the description Examples of typical strong magnetic fields at the cathode surface.
Figure 33:
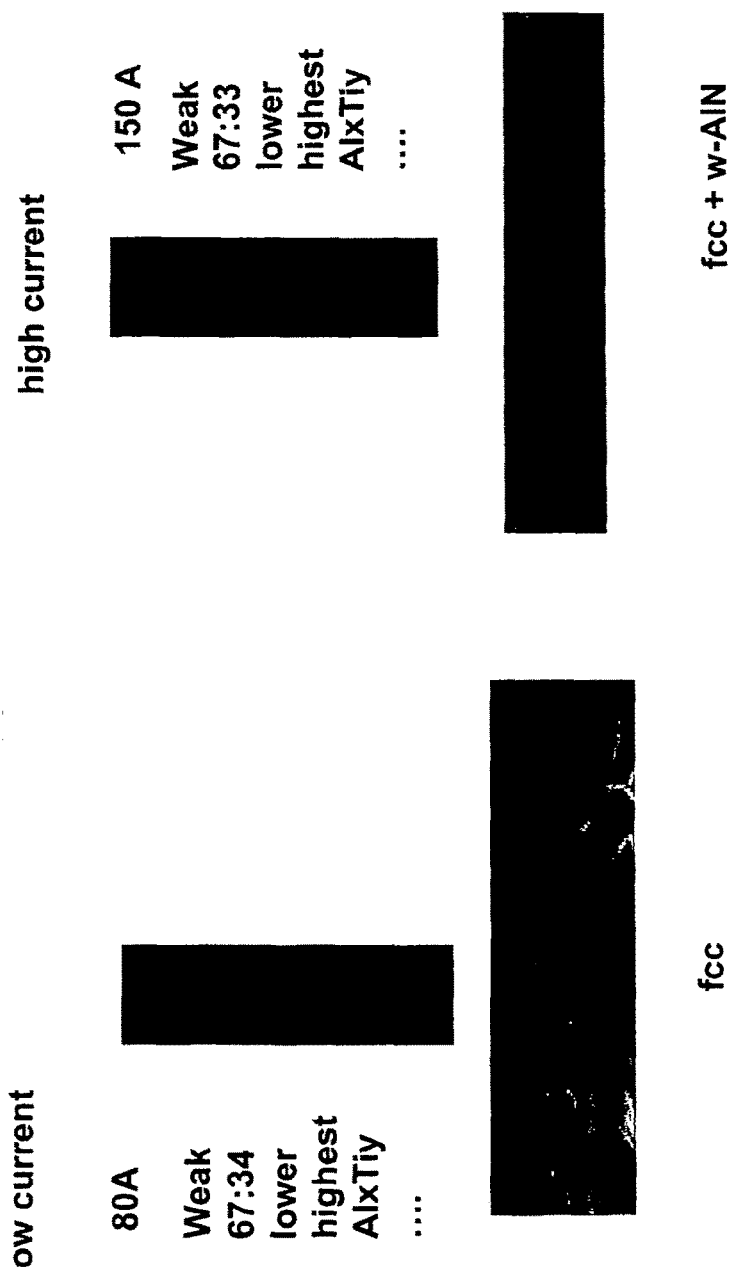
FIG. 33 shows a chart with the description Example changing the morphology by setting the evaporator current for the weak magnetic field.
Figure 34:
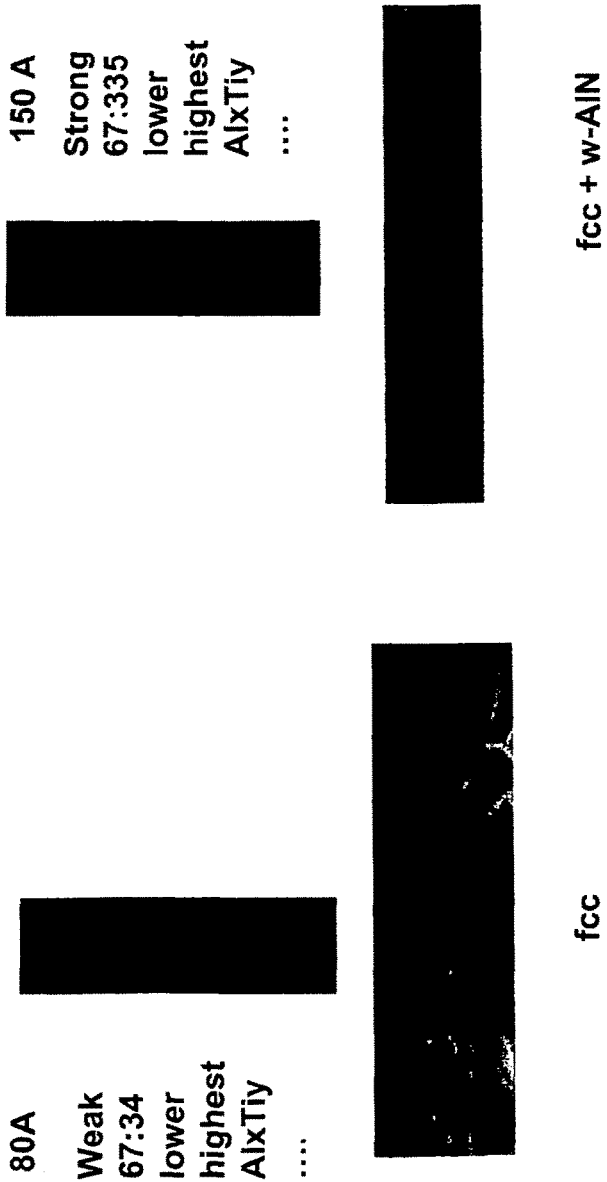
FIG. 34 shows a chart with the description Example combination of evaporators equipped with a weak magnetic field+evaporators with a strong magnetic fields.
Figure 36:
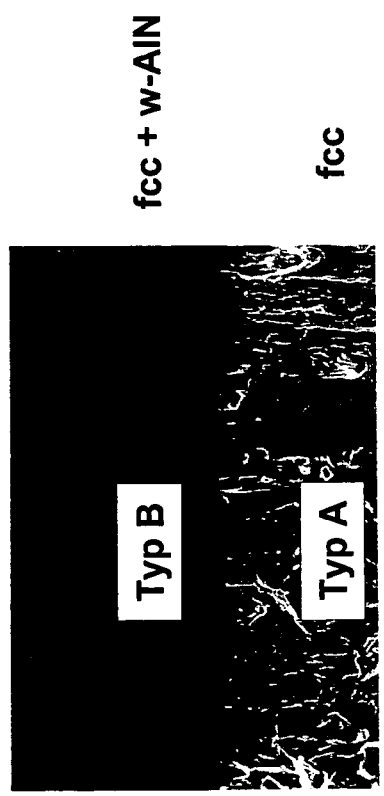
FIG. 36 shows a chart with the description Example two layers.
Figure 37:
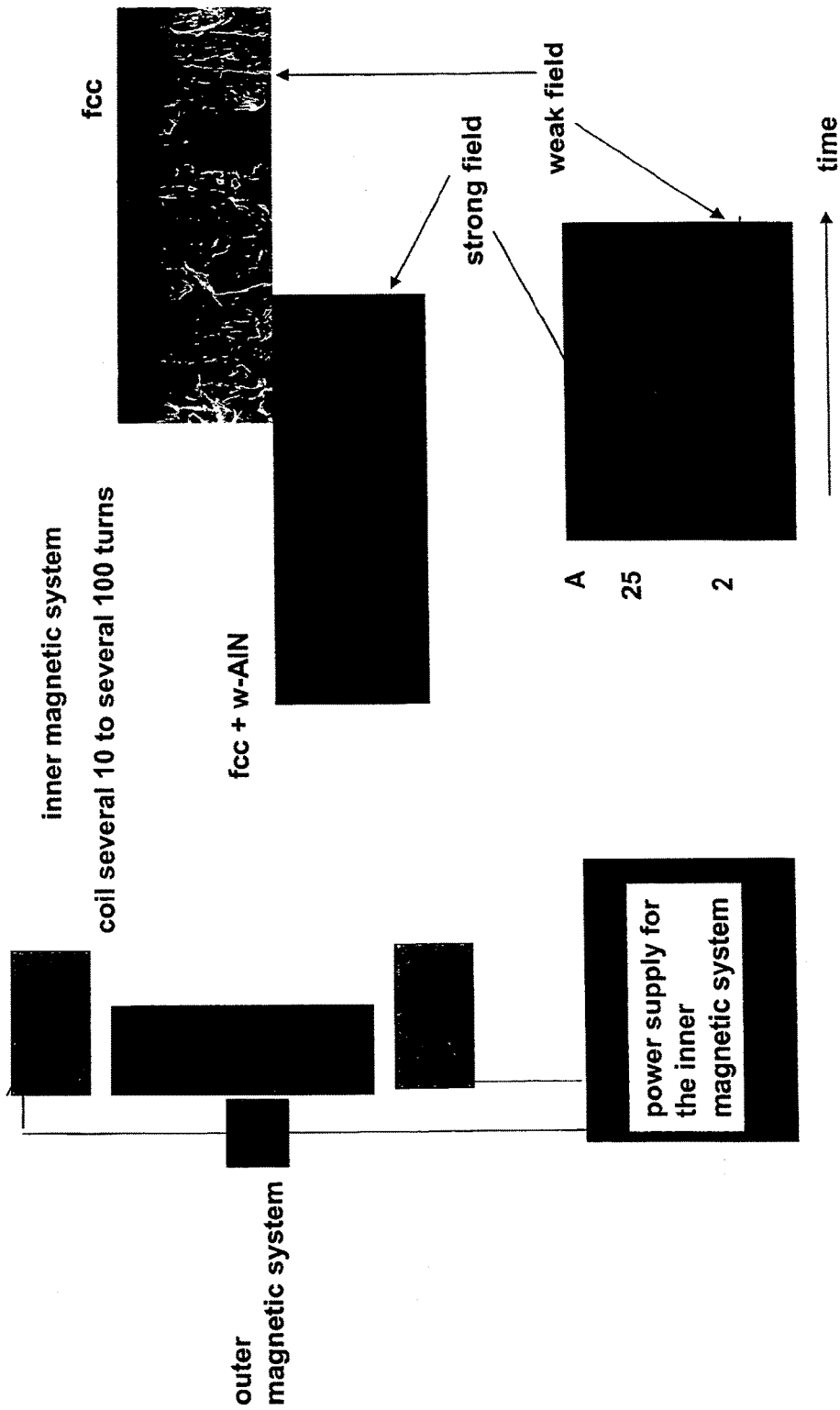
FIG. 37 shows a chart with the description Example for the generation of weak and strong magnetic field with the same evaporators.
Figure 38:
FIG. 38 shows a chart with the description multilayer stack.
Figure 39:
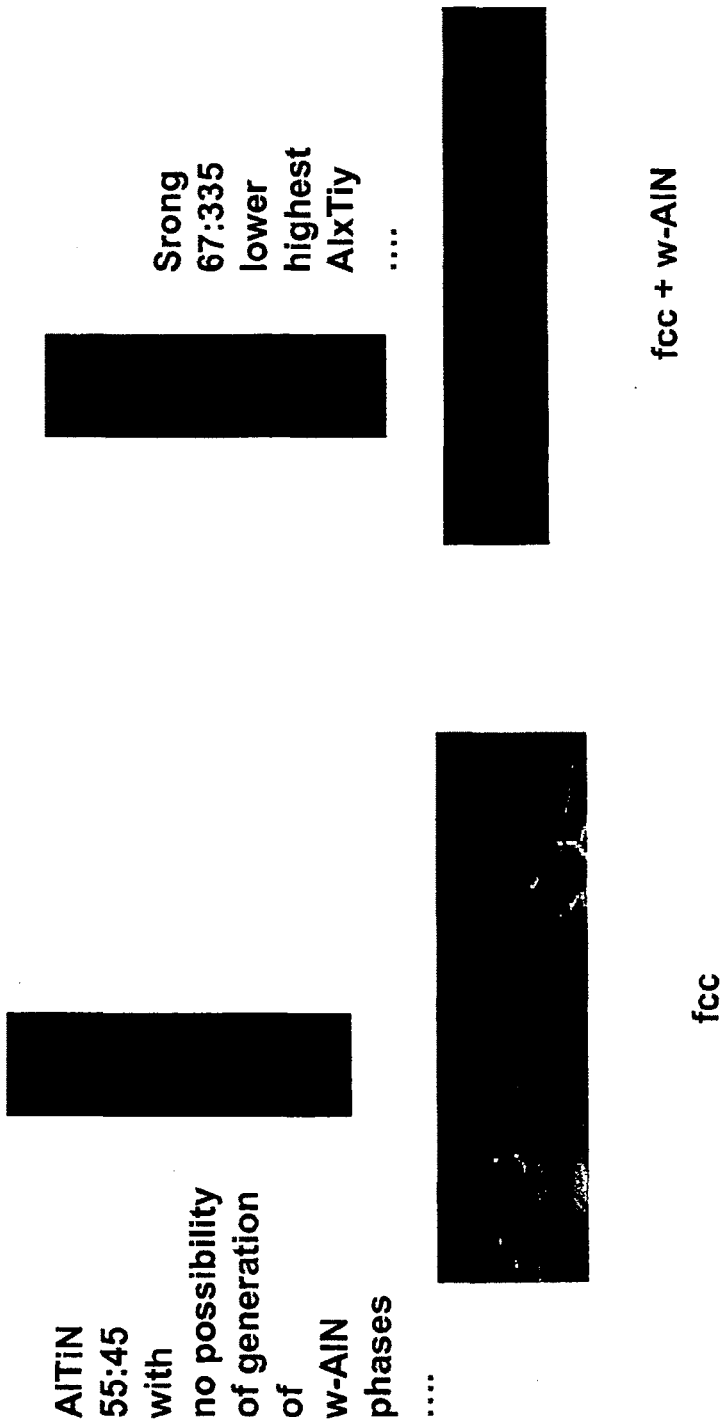
FIG. 39 shows a chart describing AlTiN 55:45.

With reference to FIGS. 1-39, the present invention relates to a wear resistant PVD coating for chip forming metal machining cutting tools. The coating comprises at least one A layer and at least one B layer, where A and B have essentially the same chemical composition but differ from each other with respect to their average grain widths, $w_A$ and $w_B$, so that $w_A < w_B$. The grain width, w, of a layer is evaluated on a fracture cross section scanning electron microscopy (SEM) image over at least 20 grains along a line perpendicular to the growth direction in the centre of the layer. With essentially the same chemical composition it is herein meant that the A and B layers are deposited from identical cathodes. Due to differences in process conditions for A and B layer deposition, the resulting A and B layers contain the same chemical elements but the atomic content of each element may vary within approximately ±3 at. % units.

Preferably, each A layer is fine grained with $2<w_A<50$ nm, each B layer has coarse and essentially columnar grains with $30<w_B<500$ nm, and $w_B/w_A>2$. The thickness of each A layer is between 0.03 and 5 μm, preferably between 0.05 and 2 μm, and the thickness of each B layer is between 0.1 and 5 μm, preferably between 0.2 and 2 μm. The number of A and B layers is between 2 and 200, preferably between 2 and 40, most preferably between 2 and 20. The total thickness of all A and B layers is between 0.3 and 20 μm, preferably between 0.5 and 10 μm. The transitions between A and B layers are preferably either abrupt or gradual, but the coating can also comprise one or more intermediate layers between A and B layers to a thickness of between 0.5 and 20 μm.

The present invention also relates to a coating comprising one or more layers with a continuous variation between fine and coarse grain size. A and B layers are then defined as selected layer portions of fine and coarse grain size, respectively, where each layer portion is perpendicular to the growth direction and has a thickness of at least 0.1 μm, and wherein the average grain widths are evaluated.

The coating according to the invention may further comprise an inner single- and/or multilayer, as known in the art, located between the substrate and the first A or B layer, and/or an outer single- and/or multilayer, located onto the last A or B layer, to a total coating thickness of between 0.5 and 30 μm, preferably between 0.5 and 15 μm and most preferably between 0.5 and 10 μm.

In one preferred embodiment the A and B layers have compositions according to the chemical formula $(Ti_{1-x1-y1}Al_{x1}Me_{y1})(N_{1-a1}Q_{a1})_{z1}$, where $0.3<x1<0.7$, $0≤y1<0.3$, preferably $0≤y1<0.15$, most preferably $y1=0$, $0.90<z1<1.10$, preferably $0.96<z1<1.04$, $0≤a1<0.5$, preferably $0≤a1<0.3$, most preferably $a1=0$. Me is one or more of Zr, Hf, V, Nb, Ta, Cr, Y, Sc, Ce, Mo, W, and Si, preferably one or more of Zr, Hf, V, Nb, Cr, Ce, and Si, and Q is one or more of C, B, S, and O.

In another preferred embodiment the A and B layers have compositions according to the chemical formula $(Ti_{1-x2-y2}Si_{x2}Me_{y2})(N_{1-a2}Q_{a2})_{z2}$, where $0.02<x2<0.25$, $0≤y2<0.3$, preferably $0≤y2<0.15$, most preferably $y2=0$, $0.90<z2<1.10$, preferably $0.96<z2<1.04$, $0≤a2<0.5$, preferably $0≤a2<0.3$, most preferably $a2=0$. Me is one or more of Zr, Hf, V, Nb, Ta, Cr, Y, Sc, Ce, Mo, W, and Al, preferably one or more of Zr, Hf, V, Nb, Cr, Ce, and Al, and Q is one or more of C, B, S, and O.

In yet another preferred embodiment the A and B layers have compositions according to the chemical formula $(Cr_{1-x3-y3}Al_{x3}Me_{y3})(N_{1-a3}Q_{a3})_{z3}$, where $0.3<x3<0.75$, $0≤y3<0.3$, preferably $0≤y3<0.15$, most preferably $y3=0$, $0.90<z3<1.10$, preferably $0.96<z3<1.04$, $0<a3<0.5$, preferably $0<a3<0.3$, most preferably $a3=0$. Me is one or more of Zr, Hf, V, Nb, Ta, Cr, Y, Sc, Ce, Mo, W, and Ti, preferably one or more of Zr, Hf, V, Nb, Cr, Ce, and Ti, and Q is one or more of C, B, S, and O.

The coating according to the invention is deposited by PVD, preferably by cathodic arc evaporation. The variation in grain size can be achieved by several means, for example by 1) changing the magnetic field at the cathode, 2) changing the deposition temperature, 3) changing the evaporation current, and/or 4) changing the bias voltage. It is within the purview of the skilled artisan to determine by experiments the appropriate process conditions.

Example 1

A (Ti,Al)N coating according to the invention was deposited by cathodic arc evaporation onto cemented carbide inserts with main composition 90 wt % WC+10 wt % Co. Before deposition, the inserts were cleaned in ultrasonic baths of an alkali solution and alcohol. The deposition chamber was evacuated to a base pressure of less than $2.0×10^{-3}$ Pa, after which the inserts were sputter cleaned with Ar ions. The coating was deposited from TiAl composite cathodes with composition Ti:Al=34:66 in 99.995% pure $N_2$ atmosphere at a total pressure of 4 Pa, using a bias voltage of −80 V and an evaporation current of 90 A at 450° C. The magnetic field in front of the cathode surface was adjusted between two levels, $M_{strong}$ and $M_{weak}$, to yield A and B layers, respectively, where $M_{strong}$ is mainly perpendicular to the cathode surface and has a field strength varying over the cathode surface in the range 3-20 mT, and $M_{weak}$ is also mainly perpendicular to the cathode surface with a field strength in the range 0.5-2.5 mT. First, a B layer was deposited at $M_{weak}$ for 20% of the total deposition time, then an A layer at $M_{strong}$ for 30%, and then the same sequence was repeated once.

The coating was studied with scanning electron microscopy (SEM). FIG. 1 shows SEM images of a fracture cross section where the A and B layers are clearly seen. The average grain width, w, was evaluated along the lines in FIG. 1b. The A layers have fine, equiaxed grains with ~19 nm and the B layers have coarser, columnar grains with w~61 nm. The total layer thickness is about 2 μm.

Example 2

The coating from example 1 was tested in a milling operation with the following data:
Geometry: XOEX120408R-M07
Application: Square shoulder milling
Work piece material: AISI 316L
Cutting speed: 160 m/min
Feed: 0.15 mm/tooth
Depth of cut: 2 mm
Width of cut: 13 mm (26%)
Tool life criteria: Flank wear (vb)>0.3 mm As references, two commercially available (Ti,Al)N coatings of similar composition and thickness as the inventive coating was used, Ref1 and Ref2. Ref1 is current state-of-the-art for this specific milling application and has columnar and coarse grains with w~100 nm. Ref2 is fine grained with w~15 nm.

| Coating | Tool life |
|---|---|
| Inventive | 15 min |
| Ref1 | 15 min |
| Ref2 | 5 min |

The table shows that the attained tool life for the inventive coating was found to be similar to that of Ref1 and significantly higher than that of Ref2.

Example 3

The coating from example 1 was tested in fine machining with coated end mills using the following data:
Geometry: 10 mm square shoulder cemented carbide end mill
Application: Square shoulder milling
Work piece material: Ck45W
Cutting speed: 120 m/min (3800 rpm)
Feed: 0.05 mm/tooth (380 mm/min)

Depth of cut: 13 mm
Width of cut: 5 mm
Tool life criteria: Cutting edge condition (swarf deterioration)

As references, the same commercially available (Ti,Al)N coatings as in example 2 were used, Ref1 and Ref2. Ref2 is current state-of-the-art for this specific application.

| Coating | Cutting length |
|---|---|
| Inventive | 60 m |
| Ref1 | 10 m |
| Ref2 | 60 m |

The table shows that the attained tool life for the inventive coating was found to be similar to that of Ref2 and significantly higher than that of Ref1.

The Invention relates also to a deposition method as well as to a coating comprising a fine morphology as described in greater detail in the following.

The Deposition method preferably using the vacuum arc evaporation to deposit AlTiN coatings with a composition minimal: $(Al_xTi_{1-X})$ N $55 </= X </= 74$ at % ?????
upgrading 1 $(Al_xMe_{1-X})$ N, Me: Ti or alloys with Cr, Zr, Hf, V 4-5 group elements
upgrading 2 $(Al_aMe_{1-a-b} X_b)$ N, X: B, S, Y, Ce, Sc $0 </= b < 10$ at % having at least one layer showing a fine morphology and consisting of majority phase of a fcc-lattice type combined with a certain content of the w-AlN-lattice type, characterized by selection of the evaporator current in combination with the magnetic field of the evaporator.

In a special embodiment the method is using a weak magnetic field of about 0.5 to 2.5 mT with field mainly perpendicular to the cathode surface and current of at least 100 A and more at a nitrogen pressure of 0.5 to 10 Pa and bias voltages of about 20 to 300 V at deposition temperature in between 300 to 700° C.

The method can also use a strong magnetic field of about 3 to 20 mT with field mainly perpendicular to the cathode surface and current of at least 50 A and more at a nitrogen pressure of 0.5 to 10 Pa and bias voltages of about 20 to 300 V at deposition temperature in between 300 to 700° C.

The deposition method according to the invention can be used to generate multilayer structures consisting at least of two layers: layer A as a pure fcc-lattice type and layer B having a certain w-AlN-lattice type content.

Preferably, a low evaporator current (30 . . . 100) A is used to generate layer A and a high evaporator current (100 . . . 300) A to generate layer B respectively.

Advantageously a PVD-system is used equipped both with evaporator having a weak magnetic field as described above to generate a layer of type A and having a strong magnetic field to generate a layer of type B as mentioned before.

Regarding an other embodiment, evaporators are used with adjustable magnetic field varying between the week magnetic field and the strong magnetic field.

The invention also relates to a method to change the magnetic field strength by changing the position of the magnets by a mechanical movement or changing the coil current of an electrical magnetic system.

Furthermore the invention relates to a Layer B as described above characterized by the measurement of the minor w-AlN phase by X-ray diffraction inspection showing when deposited on cemented carbide using the 1120 peak, as well as to coatings according to the invention showing a lower intrinsic stress than coatings with a columnar pure fcc-lattice type.

In the following, the invention is described and characterized in greater detail.

The invention claimed is:

1. A method of coating a machine cutting tool, comprising:
depositing, on the machine cutting tool, plural AlTiN alternating coating layers using cathodic arc evaporation with a cathode,
wherein said plural AlTiN alternating coating layers differ in average grain width and comprise:
at least one first layer comprising:
a first composition; and
a first average grain width of between 2 nm and 50 nm; and
at least one second layer in contact with the at least one first layer and comprising:
a second composition; and
a second average grain width of between 30 nm and 500 nm,
wherein the first composition is the same as the second composition to within plus or minus 3 at. % units for each chemical element of said first and second compositions; and
wherein a ratio of the first average grain width to the second average grain width is greater than two.

2. The method of claim 1, wherein the depositing comprises depositing with a same cathode the plural AlTiN alternating coating layers using cathodic arc evaporation.

3. The method of claim 1, wherein the depositing comprises depositing, with identical composition cathodes, the plural AlTiN alternating coating layers using cathodic arc evaporation.

4. The method of claim 1, wherein the depositing comprises depositing, with different process conditions, the plural AlTiN alternating coating layers using cathodic arc evaporation.

5. The method of claim 1, wherein the depositing utilizes process parameters for the at least one first layer that include:
a first magnetic field at the cathode;
a first deposition temperature;
a first evaporation current; and
a first bias voltage.

6. The method of claim 5, wherein the depositing utilizes process parameters for the at least one second layer that include:
a second magnetic field at the cathode that is different than the first magnetic field;
a second deposition temperature;
a second evaporation current; and
a second bias voltage.

7. The method of claim 5, wherein the depositing utilizes process parameters for the at least one second layer that include:
a second magnetic field at the cathode;
a second deposition temperature that is different than the first deposition temperature;
a second evaporation current; and
a second bias voltage.

8. The method of claim 5, wherein the depositing utilizes process parameters for the at least one second layer that include:
a second magnetic field at the cathode;
a second deposition temperature;

a second evaporation current that is different than the first evaporation current; and
a second bias voltage.

9. The method of claim 5, wherein the depositing utilizes process parameters for the at least one second layer that include:
a second magnetic field at the cathode;
a second deposition temperature;
a second evaporation current that is between 100 and 300 A and the first evaporation current is between 30 and 100 A; and
a second bias voltage.

10. The method of claim 5, wherein the depositing utilizes process parameters for the at least one second layer that include:
a second magnetic field at the cathode;
a second deposition temperature;
a second evaporation current; and
a second bias voltage that is different than the first bias voltage.

11. The method of claim 1, wherein the at least one first layer has a thickness of between 0.03 μm and 5 μm.

12. The method of claim 11, wherein the at least one first layer has a thickness of between 0.05 μm and 2 μm.

13. The method of claim 1, wherein the at least one second layer has a thickness of between 0.1 μm and 5 μm.

14. The method of claim 13, wherein the at least one second layer has a thickness of between 0.2 μm and 2 μm.

15. The method of claim 1, wherein said plural AlTiN alternating coating layers comprise between 2 and 200 layers.

16. The method of claim 15, wherein said plural AlTiN alternating coating layers comprise between 2 and 40 layers.

17. The method of claim 15, wherein said plural AlTiN alternating coating layers comprise between 2 and 20 layers.

18. The method of claim 1, wherein an overall thickness of said plural AlTiN alternating coating layers is between 0.3 μm and 20 μm.

19. The method of claim 18, wherein an overall thickness of said plural AlTiN alternating coating layers is between 0.5 μm and 10 μm.

20. A method of coating a machine cutting tool, comprising:
depositing, on the machine cutting tool, plural AlTiN alternating first and second coating layers using cathodic arc evaporation with a cathode,
wherein said plural AlTiN alternating first and second coating layers differ in average grain width and:
said plural first layers comprise:
a first composition; and
a first average grain width of between 2 nm and 50 nm; and
said plural second layers comprise:
a second composition; and
a second average grain width of between 30 nm and 500 nm,
wherein the first composition is the same as the second composition to within plus or minus 3 at. % units for each chemical element of said first and second compositions; and
wherein a ratio of the first average grain width to the second average grain width is greater than two.

* * * * *